(12) United States Patent
Kanamitsu et al.

(10) Patent No.: US 7,303,951 B2
(45) Date of Patent: Dec. 4, 2007

(54) METHOD OF MANUFACTURING A TRENCH ISOLATION REGION IN A SEMICONDUCTOR DEVICE

(75) Inventors: Kenji Kanamitsu, Hitachinaka (JP); Takashi Moriyama, Tsuchiura (JP); Naohiro Hosoda, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 466 days.

(21) Appl. No.: 11/028,867

(22) Filed: Jan. 5, 2005

(65) Prior Publication Data
US 2005/0153521 A1   Jul. 14, 2005

(30) Foreign Application Priority Data
Jan. 14, 2004   (JP)   ............................. 2004-007167

(51) Int. Cl.
*H01L 21/76* (2006.01)
(52) U.S. Cl. .................. 438/221; 438/224; 438/296; 438/426; 438/437; 438/738
(58) Field of Classification Search ................ 438/221, 438/223–224, 296, 424–426, 435, 437, 738
See application file for complete search history.

(56) References Cited

U.S. PATENT DOCUMENTS 5,578,518 A * 11/1996 Koike et al. ................ 438/424
5,910,018 A * 6/1999 Jang ............................ 438/425
6,331,469 B1 * 12/2001 Park et al. ................... 438/296
6,372,606 B1 * 4/2002 Oh ............................. 438/435
6,784,077 B1 * 8/2004 Lin et al. .................... 438/426
2001/0031540 A1 * 10/2001 Lim et al. ................... 438/424
2003/0027402 A1 * 2/2003 Hsu ............................ 438/424
2003/0038337 A1   2/2003 Kanamitsu et al.

FOREIGN PATENT DOCUMENTS

| JP | 63-002371 | 1/1988 |
| JP | 02-260660 | 10/1990 |
| JP | 2000-200878 | 7/2000 |

* cited by examiner

*Primary Examiner*—Zandra V. Smith
*Assistant Examiner*—Toniae M Thomas
(74) *Attorney, Agent, or Firm*—Antonelli, Terry, Stout & Kraus, LLP.

(57) ABSTRACT

A method of manufacturing a semiconductor device for preventing dielectric breakdown of gate electrodes attributable to needle-like protrusions caused inside a trench in the step of forming element isolation trench in which includes forming a silicon oxide film over a silicon nitride film as an etching mask for forming element isolation trenches, then cleaning the surface of a substrate with a hydrofluoric acid etching solution to lift off obstacles deposited over the surface of the silicon oxide film, before the step of patterning the silicon nitride film by using as a mask a photoresist film provided with an anti-reflection film therebelow.

21 Claims, 26 Drawing Sheets

METHOD OF MANUFACTURING A TRENCH ISOLATION REGION IN A SEMICONDUCTOR DEVICE

CROSS-REFERENCE TO RELATED APPLICATION

The present application claims priority from Japanese patent application No. 2004-007167 filed on Jan. 14, 2004, the content of which is hereby incorporated by reference into this application.

BACKGROUND OF THE INVENTION

The present invention concerns a technique for manufacturing a semiconductor device and, more in particularly, it relates to a technique effective to application for a method of manufacturing a shallow trench isolation (STI) to a semiconductor substrate.

A general method of forming a shallow trench isolation to a semiconductor substrate is as described below. At first, a single crystal silicon substrate is thermally oxidized to form a thin silicon oxide film on the surface thereof and a silicon nitride film is further deposited thereover by a CVD (Chemical Vapor Deposition) method and then the silicon nitride film and the silicon oxide film in an element isolation region are removed by dry etching using a photoresist film as a mask. Then, after removing the photoresist film and forming a trench to the substrate by dry etching using a silicon nitride film as a mask, the substrate is thermally oxidized to form a thin silicon oxide film to the inner wall of the trench. The silicon oxide film is formed with an aim of removing etching damages caused to the inner wall of the trench and for stress relaxation of the silicon oxide film buried inside the trench by the subsequent step.

Then, after depositing a thick silicon oxide film over the substrate including the inside of the trench by the CVD method, the substrate is heat treated to shrink fit (densify) the silicon oxide film buried inside the trench. Successively, the silicon oxide film over the silicon nitride film is removed by a chemical mechanical polishing (CMP) method to leave the silicon oxide film only inside the trench and then the silicon nitride film which is no more required is removed by etching.

In the shallow trench isolation formed by the method described above, since a step is formed between the surface of the silicon substrate and the surface of the silicon oxide film in the shallow trench isolation when the silicon nitride film is removed, this leads to a phenomenon that the silicon oxide film at the end of the shallow trench isolation is recessed downward in the subsequent cleaning step.

Accordingly, it has been know that the thickness of the gate oxide film formed to the surface of the substrate in the active region is locally decreased at the end (shoulder) of the active region and the electric field of the gate voltage is concentrated to the shoulder to result in a problem that drain current flows even at a low gate voltage (referred to as kink characteristic) and, as a countermeasure for solving the problem, a technique of rounding the shoulder in the active region, etc. has been proposed.

For example, Japanese Unexamined Patent Publication No. Sho 63(1998)-2371 (refer to Patent Document 1) points out a problem that the so-called narrow channel effect that the threshold voltage (Vth) lowers in a case of forming a micro-fine MISFET with the channel width of 1 µm or less in an active region of a substrate surrounded with the shallow trench isolation develops making it impossible for use as the device. Then, for suppressing such a narrow channel effect, It discloses a technique of providing the shoulder in the active region with a curvature (roundness) by conducting wet oxidation at 950°C. after forming the french in the substrate and preventing the lowering of the threshold voltage by making the thickness of the gate oxide film larger at the shoulder of the active region.

In Japanese Unexamined Patent Publication No. Hei 2(1990)-260660 (refer to Patent Document 2), the shoulder in the active region is rounded substantially by the following method. At first, a device forming region of a semiconductor substrate is covered with a mask comprising a stacked film of an oxide film and an oxidation resistant film and the substrate is thermally oxidized in this state, thereby forming an oxide film to the surface of the element isolation region such that one end thereof intrudes to the device forming region. Then, the oxide film in the element isolation region is removed by wet etching using the oxidation resistant film as a mask and, successively, forming a trench in the substrate at the element isolation region by reactive ion etching using the oxidation resistant film as a mask and then the substrate is thermally oxidized to form a thermally oxidized film on the inner wall surface of the trench and, at the same time, providing the roundness to the shoulder of the trench.

Japanese Unexamined Patent Publication No. 2000-200878 (corresponding to U.S. Patent Publication No. 2003-0038337A1) (refer to Patent Document 3) describes a method of forming the following structure at the corner of an active region and an element isolation trench. That is, the shoulder of the active region forms an inclined surface descending toward the side wall of the element isolation trench. The inclined surface includes two inclined surfaces ($S_1$, $S_2$) of different angles of inclination. The first inclined surface ($S_1$) near the central portion of the active region L is a relatively steep inclined surface while the second inclined surface ($S_2$) near the side wall of the element isolation trench 2 is an inclined surface more moderate than the first inclined surface ($S_1$). Further, the surface of the substrate 1 at the shoulder of the active region L is entirely rounded and no angled region is present.

[Patent Document 1] Japanese Unexamined Patent Publication No. Sho 63(1998)-2371

[Patent Document 2] Japanese Unexamined Patent Publication No. Hei 2(1990)-260660

[Patent Document 3] Japanese Unexamined Patent Publication No. 2000-200878

SUMMARY OF THE INVENTION

The present inventors have made a study on the existent method of forming an element isolation trench and, as a result, additionally found the following problems. As described above, in the step of forming the element isolation trench, a silicon nitride film is at first deposited by way of a thin thermally oxidized silicon film over a silicon substrate and then the silicon nitride film in the element isolation region is removed by dry etching using a photoresist film as a mask. While the silicon nitride film is used as a mask upon etching the silicon substrate in the element isolation region to form a trench, since it has a nature of being less oxidized, it also functions as an oxidation resistant film for preventing the surface of the silicon substrate therebelow from oxidation.

By the way, when a photoresist film is formed over the silicon nitride film, obstacles are formed to the surface of the silicon nitride film. It is considered that the obstacles are derived mainly from the ingredients in the anti-reflection film disposed to a lower below the photoresist film, and such obstacles bring about a production failure.

The invention intends to provide a technique of removing factors for production failure induced during the step of forming element isolation trench.

The invention further intends to provide a technique capable of improving reliability of the semiconductor device.

The foregoing and other objects, as well as novel features of the invention will become apparent by the descriptions of the specification in conjunction with appended drawings.

The outline for the typical inventions among those disclosed in the present application are described simply as below.

A method of manufacturing a semiconductor device according to the invention includes the steps of:

(a) forming a silicon nitride film by way of a first silicon oxide film over the main surface of a silicon substrate;
(b) forming a second silicon oxide film over the silicon nitride film, and then forming a photoresist film in which an element isolation region is opened over the second silicon oxide film;
(c) applying a wet etching treatment to the second silicon oxide film exposed to the element isolation region, after the step (b);
(d) dry etching the silicon nitride film and the first silicon oxide film by using the photoresist film as a mask after the step (c), thereby exposing the silicon substrate in the element isolation region;
(e) removing the photoresist film;
(f) dry etching the silicon substrate by using the silicon nitride film as a mask after the step (e), thereby forming a trench to the silicon substrate in the element isolation region;
(g) forming a third silicon oxide film over the silicon substrate including the inside of the trench, then removing the third silicon oxide film outside the trench by a chemical mechanical polishing method, or a chemical mechanical polishing method followed by etching back, to leave the third silicon oxide film inside the trench, thereby forming an element isolation trench to the silicon substrate in the element isolation region; and
(h) removing the silicon nitride film.

A method of manufacturing a semiconductor device according to the invention comprises the steps of:

(a) forming a silicon nitride film by way of a first silicon oxide film over the main surface of a silicon substrate;
(b) forming a second silicon oxide film over the silicon nitride film and then forming a photoresist film in which an element isolation region is opened over the second silicon oxide film;
(c) applying a wet etching treatment to the second silicon oxide film exposed in the element isolation region after the step (b);
(d) dry etching the silicon nitride film and the first silicon film by using the photoresist film as a mask after the step (c), thereby exposing the silicon substrate in the element isolation region;
(e) removing the photoresist film;
(f) dry etching the silicon substrate by using the silicon nitride film as a mask after the step (e), thereby forming a trench to the silicon substrate in the element isolation region;
(g) oxidizing the silicon substrate exposed inside the groove and the silicon nitride film respectively by using an ISSG oxidation method after the step (f), thereby forming a third silicon oxide film on the inner wall of the trench and forming a fourth silicon oxide film on the upper surface and on the side wall of the silicon nitride film;
(h) forming a fifth silicon oxide film over the silicon substrate including inside of the groove after the step (g), removing the fifth silicon oxide film outside the trench by a chemical mechanical polishing method or a chemical mechanical polishing method, followed by etching back after the step (g), thereby forming an element isolation trench to the silicon substrate in the element isolation region;
(i) removing the silicon nitride film by wet etching; and
(j) applying a wet etching treatment to the first, fourth and fifth silicon oxide films, after the step (i).

Causes for the manufacture failure induced in the step of shallow trench isolation can be removed.

Further, the reliability of the semiconductor device can be improved.

DETAILED DESCRIPTION OF THE PREFERRED EMBODIMENT

Figure 1:
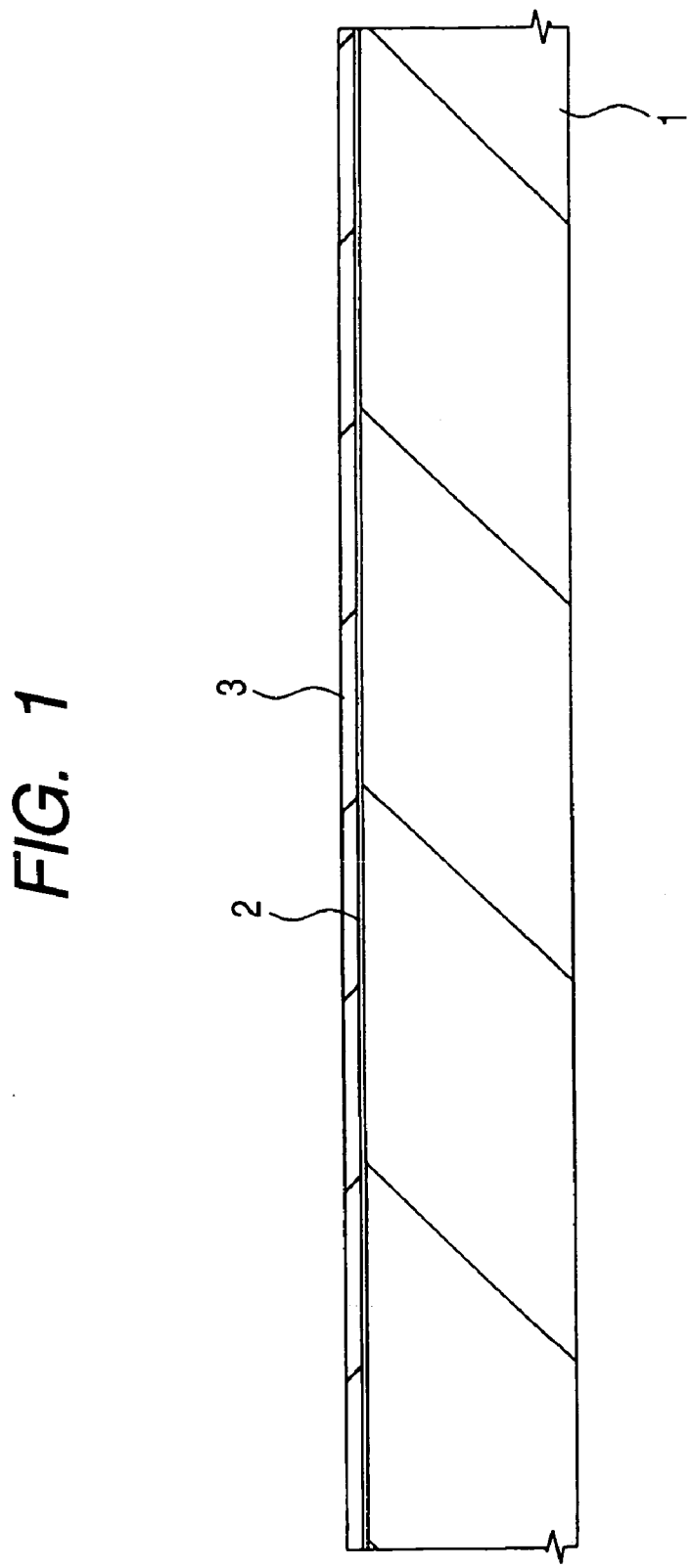
FIG. 1 is a cross sectional view for a main portion of a semiconductor substrate showing the manufacturing step of a semiconductor device as a preferred embodiment according to the present invention.

The present invention is to be described specifically by way of preferred embodiments with reference to the drawings. Throughout the drawings for explaining the preferred embodiments, identical components generally carry identical reference numerals for which duplicate descriptions are to be omitted.

At first, the manufacture failure in the step of forming an element isolation trench newly found by the present inventors is to be described. In the step of forming an element isolation trench, a silicon nitride film is at first deposited by way of a thin thermally oxidized silicon film over a silicon substrate and then the silicon nitride film in the element isolation region is removed by dry etching using a photoresist film as a mask. The silicon nitride film is used as a mask upon forming the trench by etching the silicon substrate in the element isolation region and since it has a less oxidized property, it also functions as an anti-oxidation film for preventing the surface of silicon substrate situated below from oxidation.

However, when the photoresist film is formed over the silicon nitride film, obstacles are formed on the surface of the silicon nitride film. It is considered that the obstacles are derived mainly from the ingredients in the anti-reflection film disposed to a layer below the photoresist film. Then, when the silicon nitride film in the element isolation region is dry etched in a state where the obstacles are deposited, the obstacles function as an etching mask and the silicon nitride film therebelow remains not being removed. Accordingly, when a trench is formed to the silicon substrate by dry etching using the silicon nitride film as a mask, since the silicon substrate is not etched at a portion below the silicon nitride film left below the obstacles, needle-like silicon protrusions are formed inside the trench.

Figure 26:
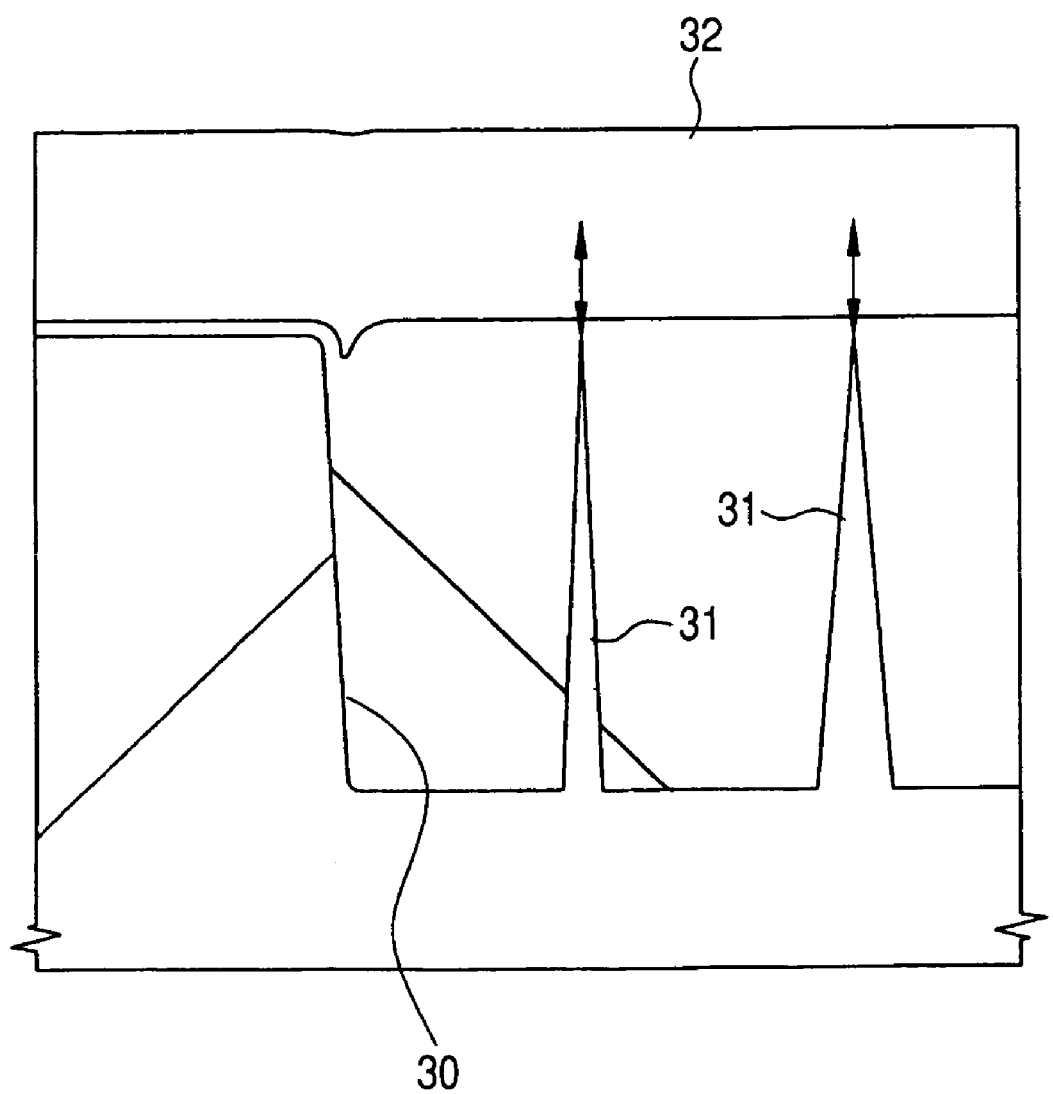
FIG. 26 is an enlarged cross sectional view for a main portion of a semiconductor substrate showing manufacturing failure caused by the existent manufacturing method.

Since the top end of the needle-like protrusion is extremely fine, the protrusion has a feature that the top end thereof is scarcely oxidized even when a thin silicon oxide film is formed to the inner wall of the trench by thermally oxidizing the silicon substrate in the next step or a feature that the electric field tends to be concentrated to the top end of the protrusion. Accordingly, when the silicon oxide film is buried inside the trench to form an element isolation trench and then a gate oxide film is formed to the surface of the silicon substrate in the active region and, further, a gate electrode is formed thereover, it brings about a problem of causing dielectric breakdown between the gate electrode traversing the element isolation trench and the needle-like silicon protrusion. FIG. 26 is a view showing the failure in the manufacture caused by the existent manufacturing method. It can be seen that dielectric breakdown is caused between the needle-like silicon protrusion 31 formed in the element isolation trench 30 and the gate electrode 32 which is formed traversing the element isolation trench 30 due to the needle-like silicon protrusion.

A manufacturing method of an MISFET according to this embodiment is to be described in the order of steps with reference to FIGS. 1 to 25.

At first, as shown in FIG. 1, a p-type single crystal silicon substrate (simply referred to as a substrate) 1 having a specific resistivity, for example, of about 1 to 10 Ωcm is thermally oxidized at about 800 to 1000° C. to form a thin silicon oxide film 2 of about 11 nm thickness on the surface and then a silicon nitride film 3 of about 190 nm to 200 nm thickness is deposited over the silicon oxide film 2 by a CVD method. The silicon nitride film 3 is used as a mask upon etching the substrate 1 in the element isolation region to form a trench and, since it has a less oxidizing property, it also functions as an anti-oxidation film for preventing the surface of the substrate 1 situated below from oxidation. The silicon oxide film 2 below the silicon nitride film 3 is formed for moderating the stress generated in the boundary between the substrate 1 and the silicon nitride film 3 and preventing occurrence of defects such as dislocation on the surface of the substrate 1 due to the stress.

Figure 2:
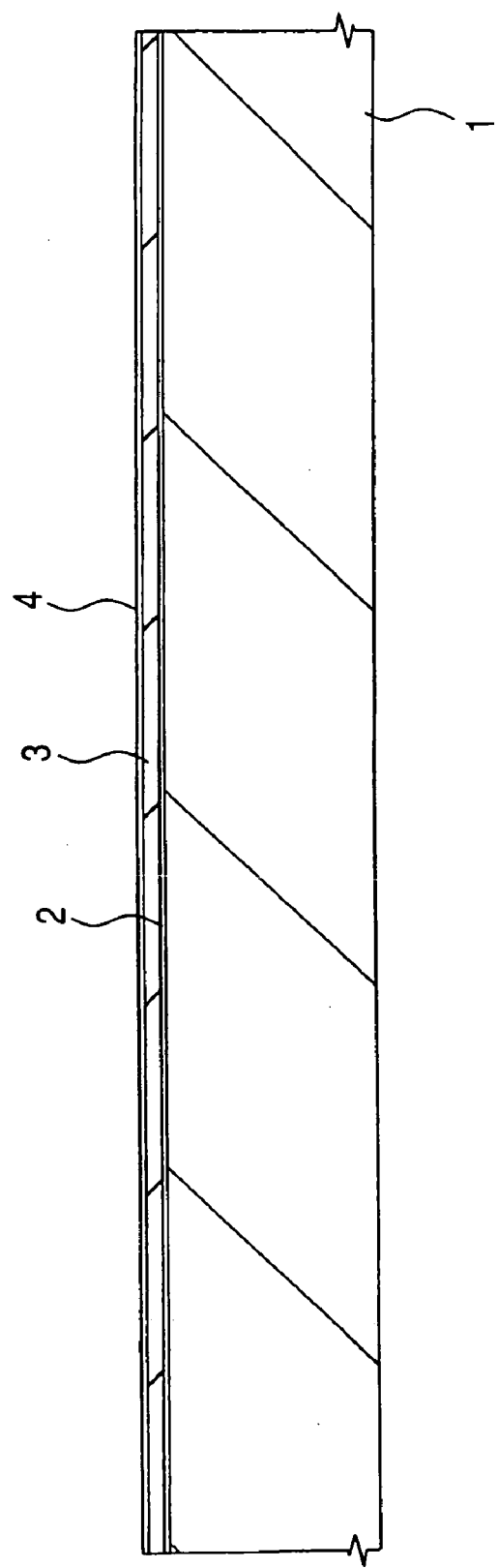
FIG. 2 is a cross sectional view for a main portion of a semiconductor substrate showing a manufacturing step of the semiconductor device succeeding to FIG. 1.

Then, as shown in FIG. 2, a silicon oxide film 4, for example, of 13 nm thickness is formed as an insulation film over the silicon nitride film 3. The silicon oxide film 4 is formed, for example, by an ISSG (In-Situ Steam Generation) oxidation method (method of directly introducing hydrogen and oxygen in a heat processing chamber at a reduced pressure and conducting radical oxidization reaction over the heated substrate) as a sort of the thermal oxidation method. The silicon oxide film 4 can be deposited also by using a CVD method in addition to the ISSG oxidation method.

Figure 3:
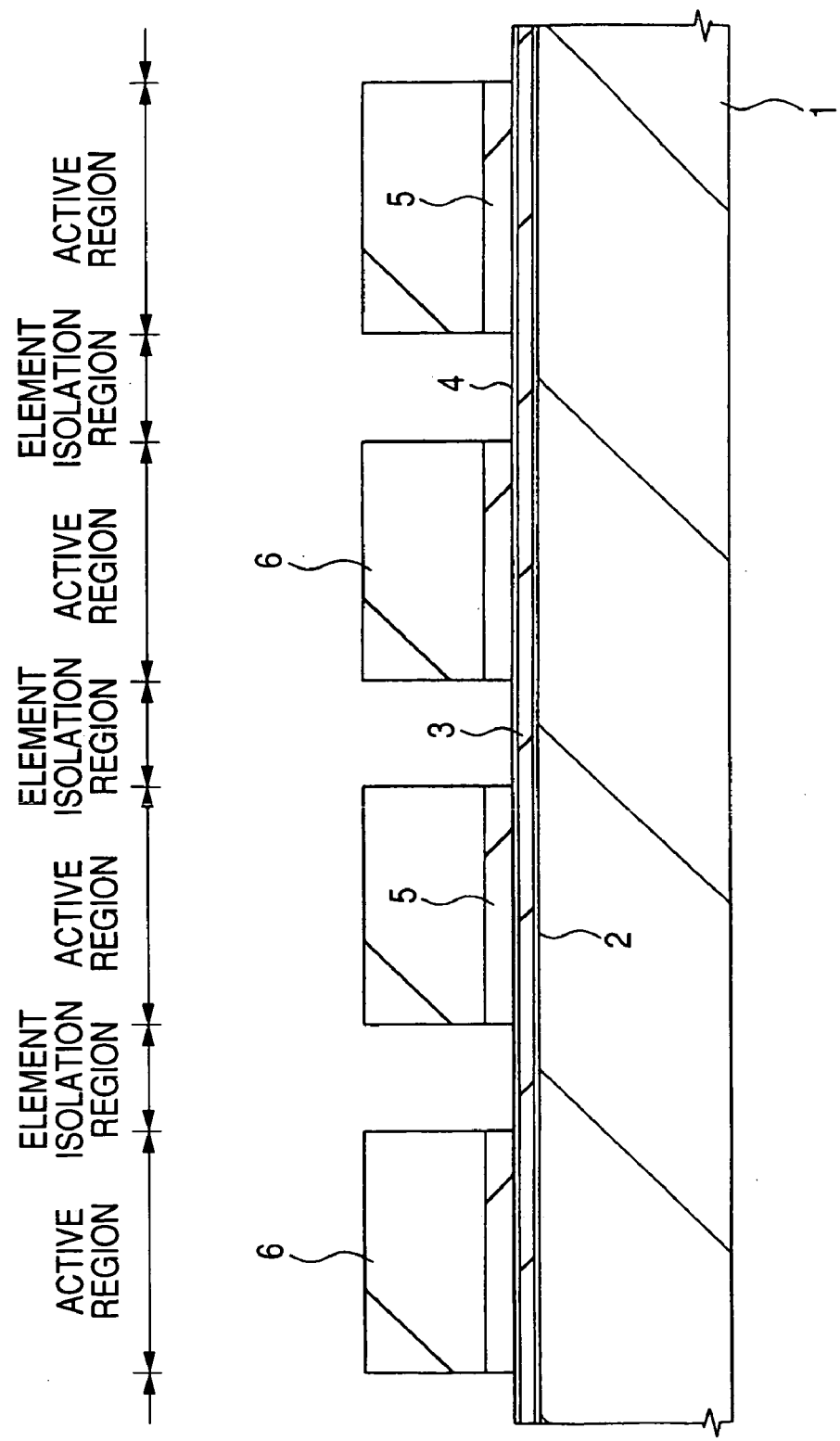
FIG. 3 is a cross sectional view for a main portion of a semiconductor substrate showing a manufacturing step of the semiconductor device succeeding to FIG. 2.
Figure 4:
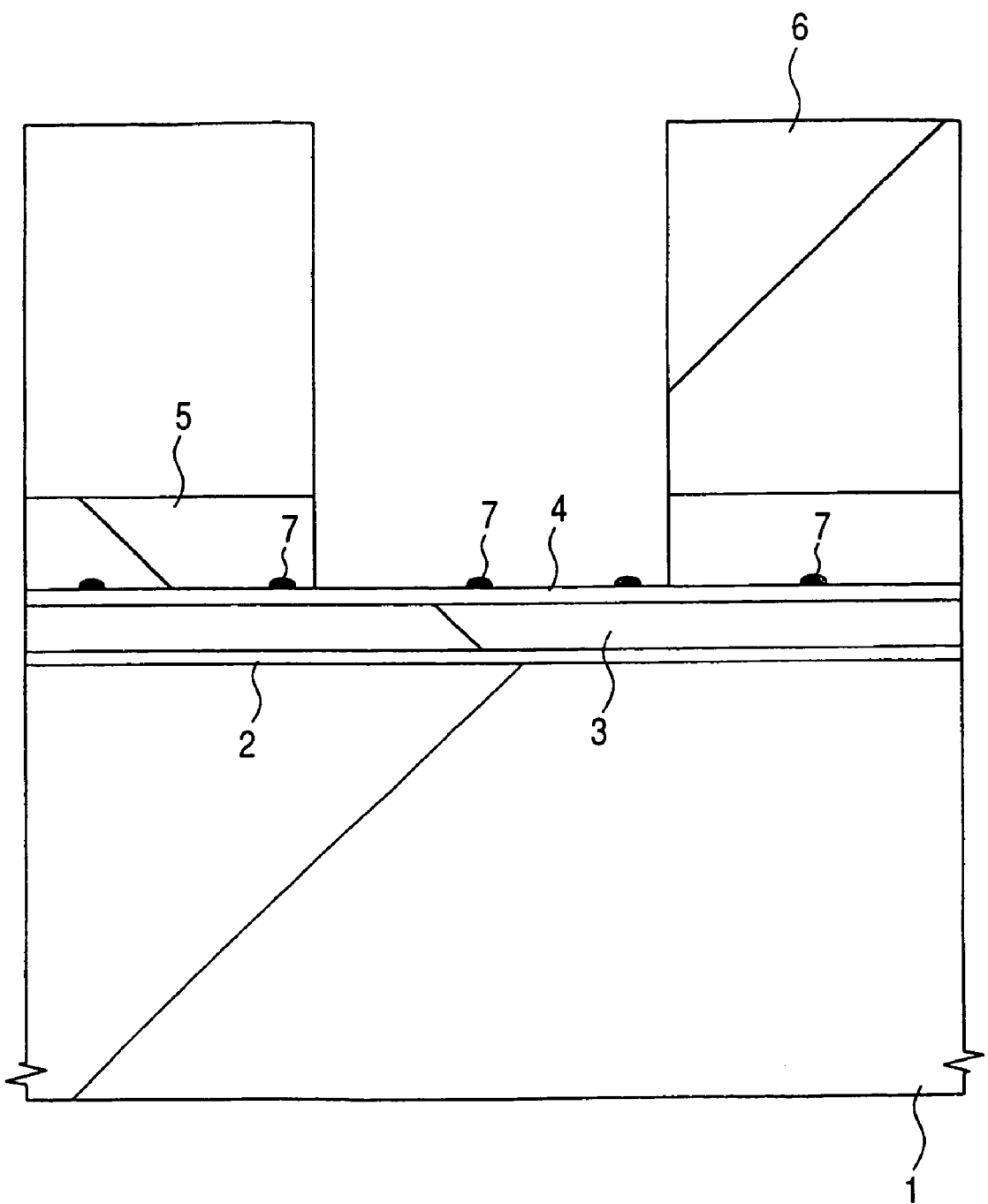
FIG. 4 is an enlarged cross sectional view for a main portion in FIG. 3.

Then, as shown in FIG. 3, after forming an anti-reflection film (BARC: Bottom Anti-Reflective Coating) 5 and a photoresist film 6 in stack over the silicon oxide film 4, exposure and development are applied to remove the anti-reflection film 5 and the photoresist film 6 in the region to form an element isolation trench. In this case, as shown in FIG. 4, obstacles 7 are formed over the surface of the silicon oxide film 4. It is considered that the obstacles 7 are derived mainly from the ingredients constituting the anti-reflection film 5 formed on the silicon oxide film 4.

Figure 5:
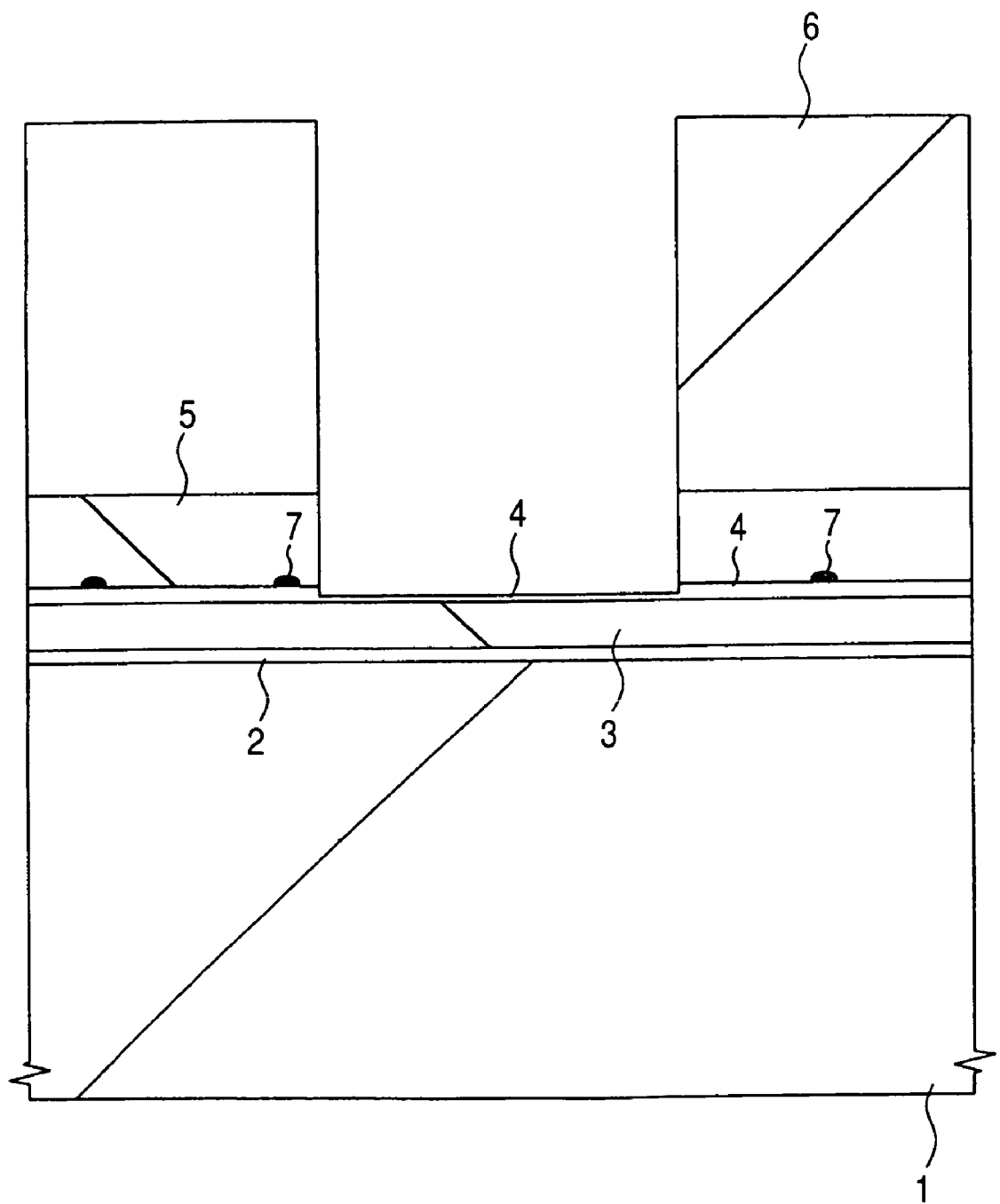
FIG. 5 is an enlarged cross sectional view for a main portion of a semiconductor substrate showing a manufacturing step of the semiconductor device succeeding to FIG. 3.

Then, in this embodiment, after applying the exposure and developing treatments, the surface of the substrate 1 is cleaned with a hydrofluoric acid etching solution. Since the silicon oxide film 4 exposed to the region from which the photoresist film 6 and the anti-reflection film 5 have been removed (element isolation region) as shown in FIG. 5 is etched, obstacles 7 deposited over the surface of the silicon oxide film 4 in the region are lifted off. That is, the insulation film (silicon oxide film 4) is formed as a protective film for preventing the formation of obstacles on the silicon nitride film 3. While the silicon oxide film 4 is interposed between the silicon nitride film 3 and the anti-reflective film 5, it is not restricted to the silicon oxide film but other thin films that can be removed by an etching solution not dissolving the silicon nitride film 3, for example, a polycrystal silicon film or amorphous silicon film may also be interposed. Also in such a case, they can function as a protective film for preventing formation of obstacles on the silicon nitride film 3 like the silicon oxide film 4.

Figure 6:
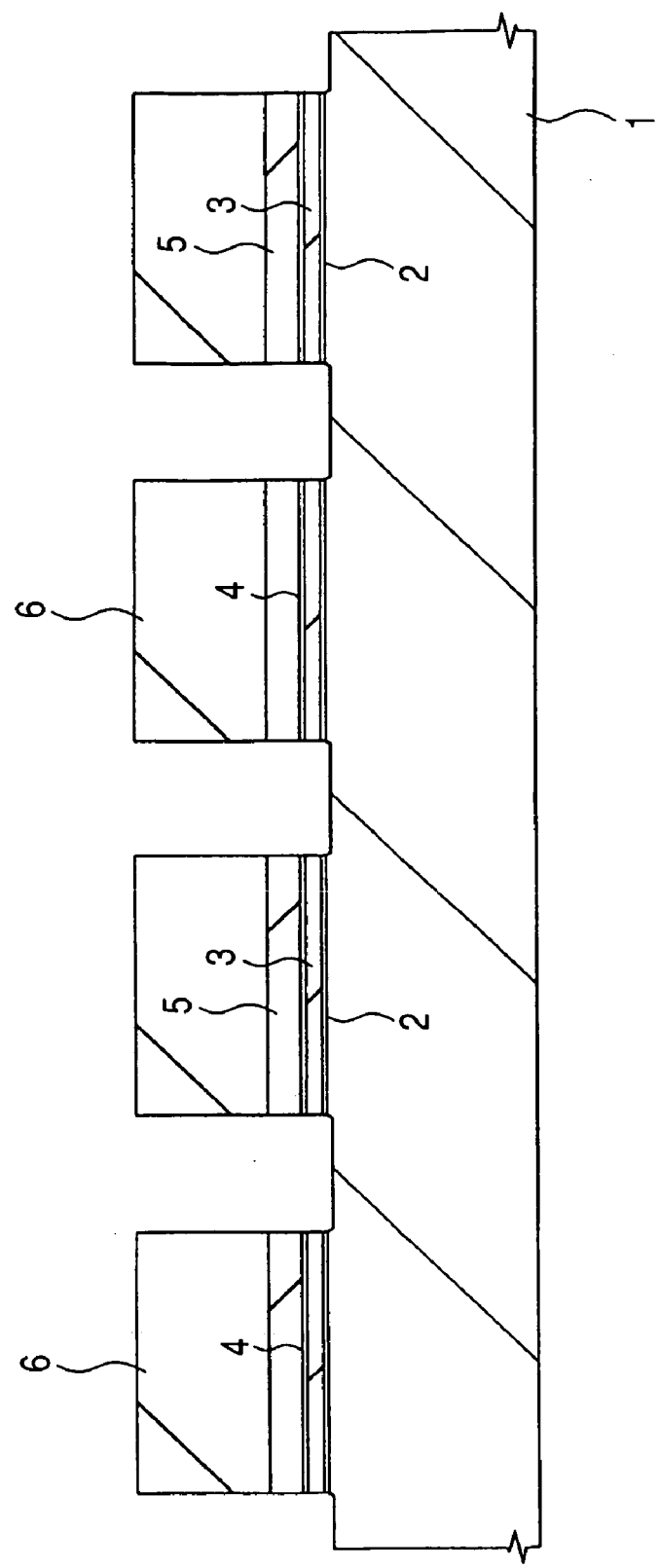
FIG. 6 is a cross sectional view for a main portion of a semiconductor substrate showing a manufacturing step of the semiconductor device succeeding to FIG. 5.

Then, as shown in FIG. 6, the silicon nitride film 3 and the silicon oxide film 2 at a layer therebelow in the element isolation region are removed by dry etching using the photoresist film 6 and the anti-reflection film 5 as a mask to expose the surface of the substrate 1. In a case where the silicon oxide film 2 remains on the surface of the exposed substrate 1, it causes occurrence of obstacles, so that the substrate 1 is over etched to completely remove the silicon oxide film 2. The amount of over etching for the substrate 1 may be about from 10 to 30 nm.

Figure 7:
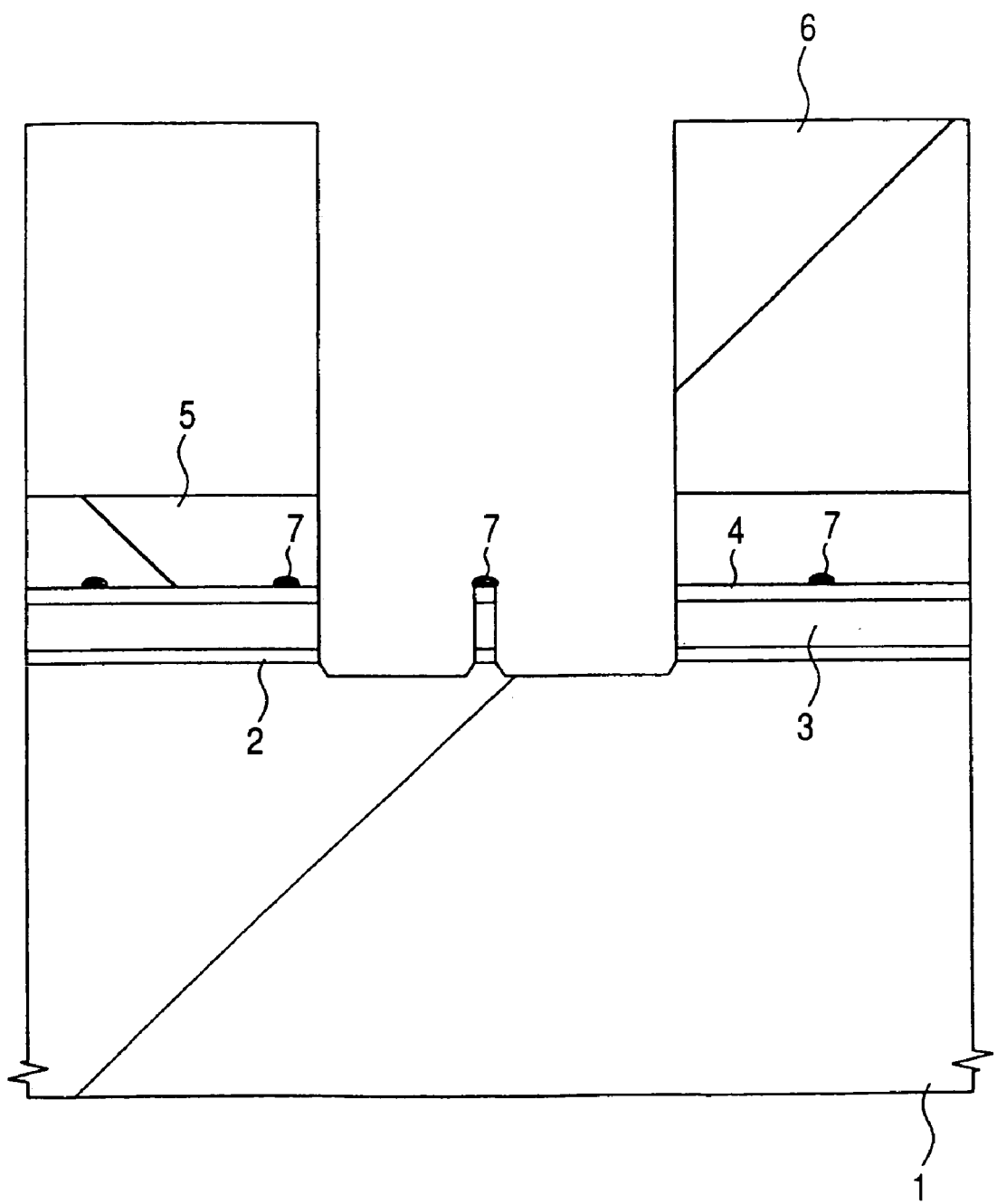
FIG. 7 is an enlarged cross sectional view for a main portion in FIG. 6.
Figure 8:
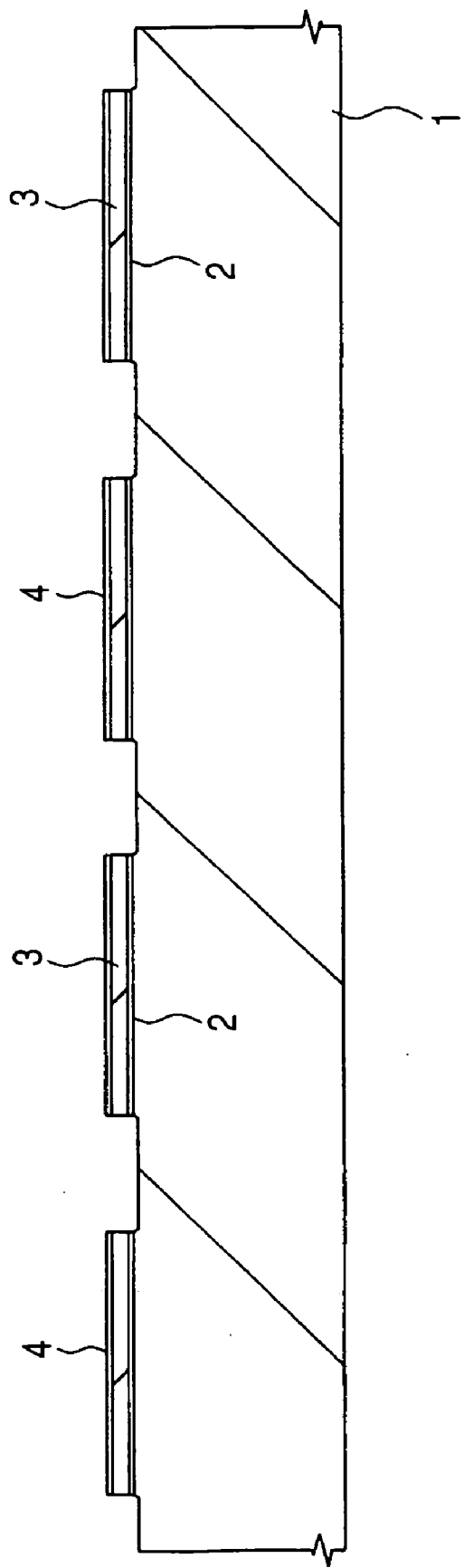
FIG. 8 is a cross sectional view for a main portion of a semiconductor substrate showing a manufacturing step of the semiconductor device succeeding to FIG. 6.
Figure 9:
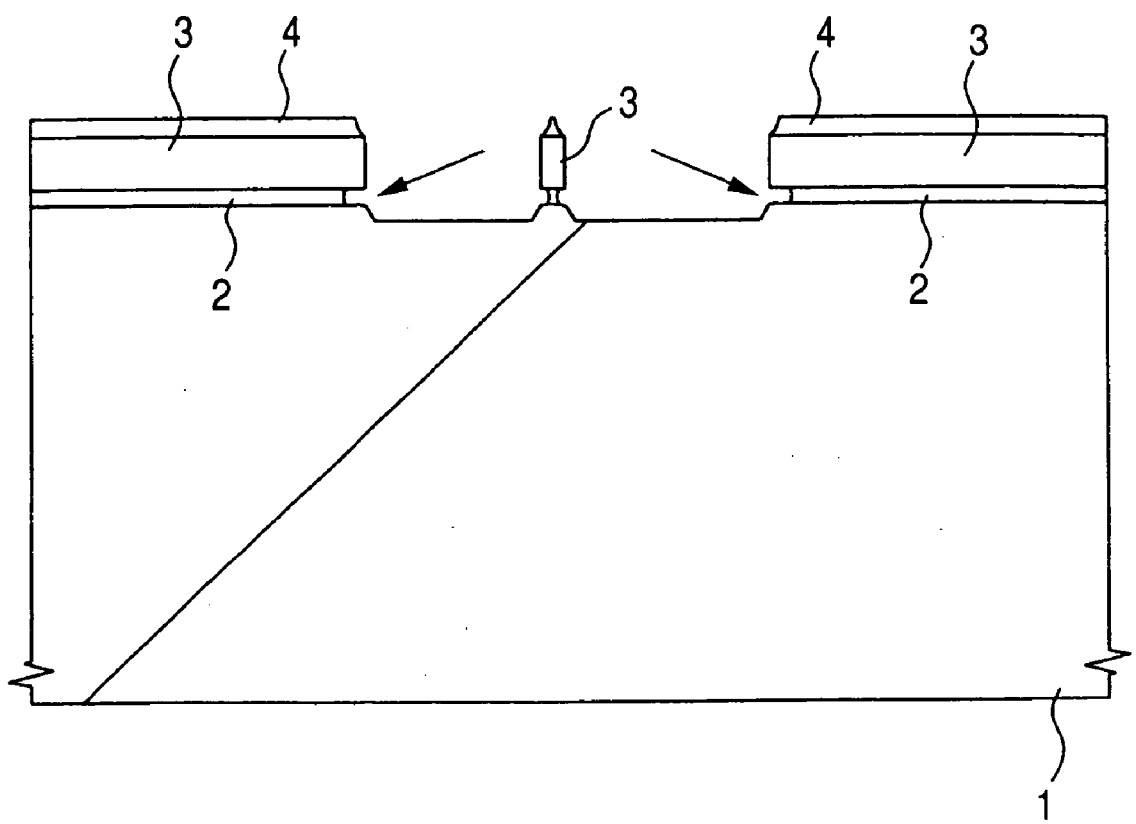
FIG. 9 is an enlarged cross sectional view for a main portion in FIG. 8.

FIG. 7 is an enlarged cross sectional view of the substrate 1 exposed by the dry etching. In the cleaning treatment with hydrofluoric acid, in a case where the etching amount of the silicon oxide film 4 is insufficient, the obstacles 7 are partially left sometimes without lifting off. In this case, since the remaining obstacles 7 act as a mask for dry etching, the insulation film (silicon oxide film 4, silicon nitride film 3 and silicon oxide film 2) below the obstacles 7 are not etched but remained on the substrate 1 when the silicon nitride film 3 and the silicon oxide film 2 in the layer therebelow are dry etched. The obstacles 7 and the insulation film therebelow (silicon oxide film 4, silicon nitride film 3 and silicon oxide film 2) are removed by the step to be described below. Then, as shown in FIG. 8, the photoresist film 6 and the anti-reflective film 5 are removed by ashing, successively, the surface of the substrate 1 is cleaned by using an SC-1 solution (mixed solution of aqueous ammonia/aqueous hydrogen peroxide) and an SC-2 solution (mixed solution of hydrochloric acid/aqueous hydrogen peroxide), and the cleaning is conducted by using a hydrofluoric acid etching solution. When the hydrofluoric acid cleaning is conducted, as shown in FIG. 9, the silicon oxide film 2 exposed below the end of the silicon nitride film 3 (portion shown by arrow in the drawing) is etched and recessed to the inner side (on the side of active region) than the end of the silicon nitride film 3. In this case, when the recessing amount of the silicon oxide film 2 is increased, since the area of contact between the silicon nitride film 3 and the silicon oxide film 2 is decreased tending to cause peeling at the boundary between both of them, it is desirable to restrict the recessing amount within a range not greatly exceeding the thickness of the silicon oxide film 2.

Figure 10:
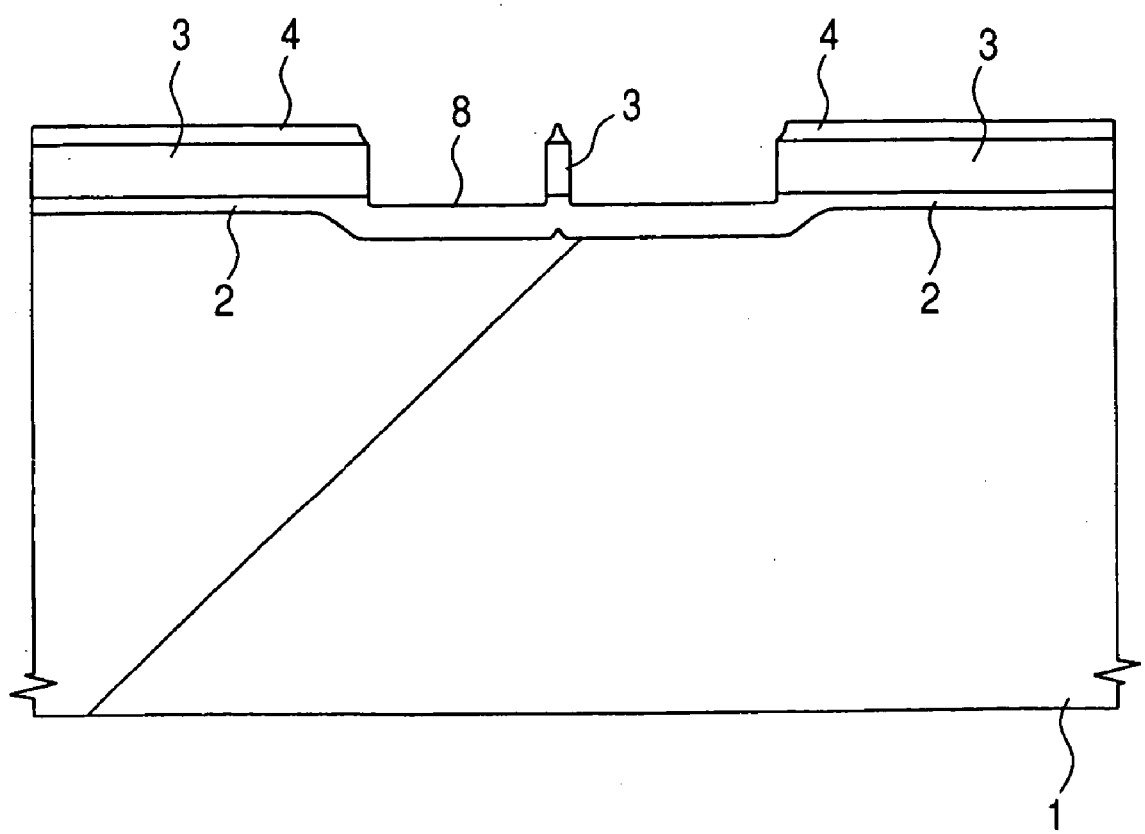
FIG. 10 is an enlarged cross sectional view for a main portion of a semiconductor substrate showing a manufacturing step of the semiconductor device succeeding to FIG. 8.

Then, as shown in FIG. 10, the substrate 1 is thermally oxidized at about 800 to 1100° C. to form a silicon oxide film 8 with a thickness greater than that of the silicon oxide film 2 (for example, about 20 nm) to the surface of the substrate 1 exposed to the element isolation region. By the thermal oxidation, the silicon oxide film 8 grows in a bird's beak shape from the end of the silicon nitride film 3 to the inner side (on the side of active region) thereof.

Figure 11:
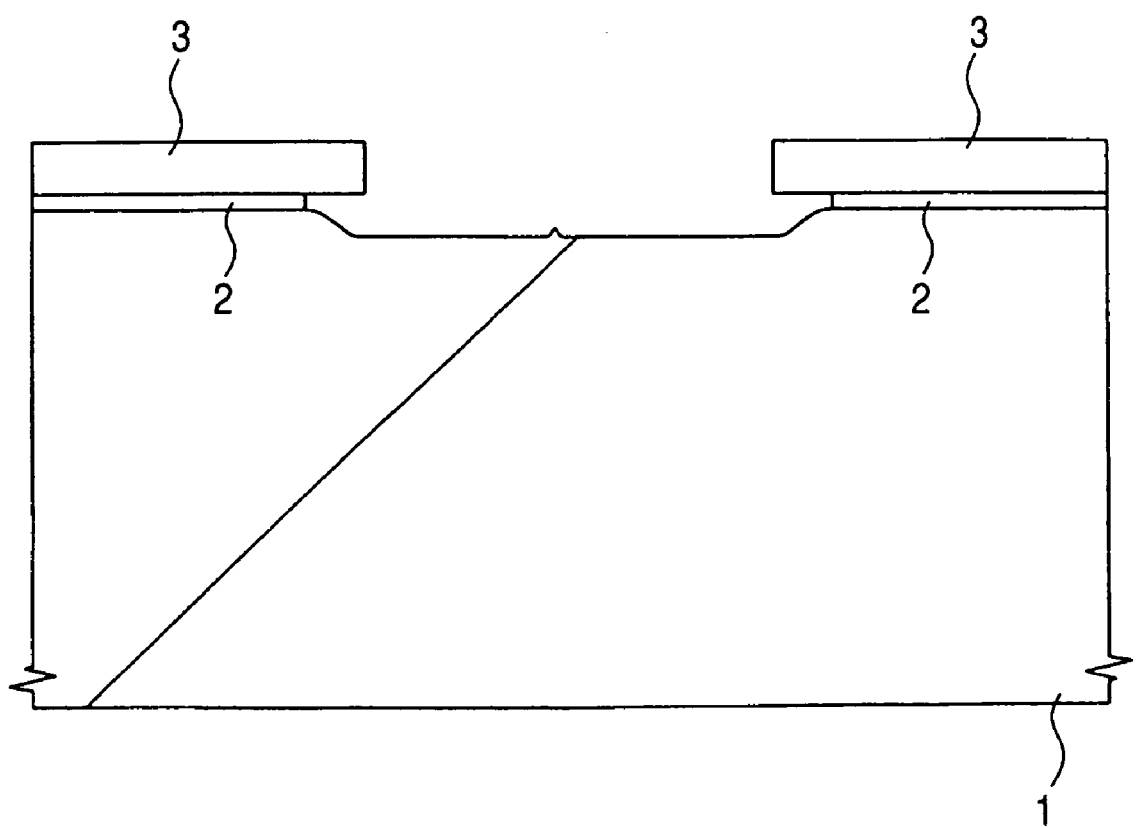
FIG. 11 is an enlarged cross sectional view for a main portion of a semiconductor substrate showing a manufacturing step of the semiconductor device succeeding to FIG. 10.

Then, as shown in FIG. 11, the silicon oxide film 8 formed by the thermal oxidation is removed by using a hydrofluoric acid etching solution. By the etching treatment, a moderate inclined surface is formed over the surface of the substrate 1 below the end of the silicon nitride film 3, and the silicon oxide film 4 over the silicon nitride film 3 is removed. Further, even in a case where the insulation film (silicon oxide film 4, silicon nitride film 3 and silicon oxide film 2) attributable to the residual obstacles are remained on the surface of the substrate 1 in the element isolation region, since the silicon oxide film 2 below the silicon nitride film 3 is removed, the silicon nitride film 3 and the obstacles 7 thereover are lifted off. That is, even in a case where the obstacles 7 are partially remained without lifting off in the step of cleaning the silicon oxide film 4 over the silicon nitride film 3 with the hydrofluoric acid etching solution (refer to FIG. 5), they can be removed simultaneously in the step of removing the silicon oxide film 8 with the hydrofluoric acid etching solution (refer to FIG. 11).

Figure 12:
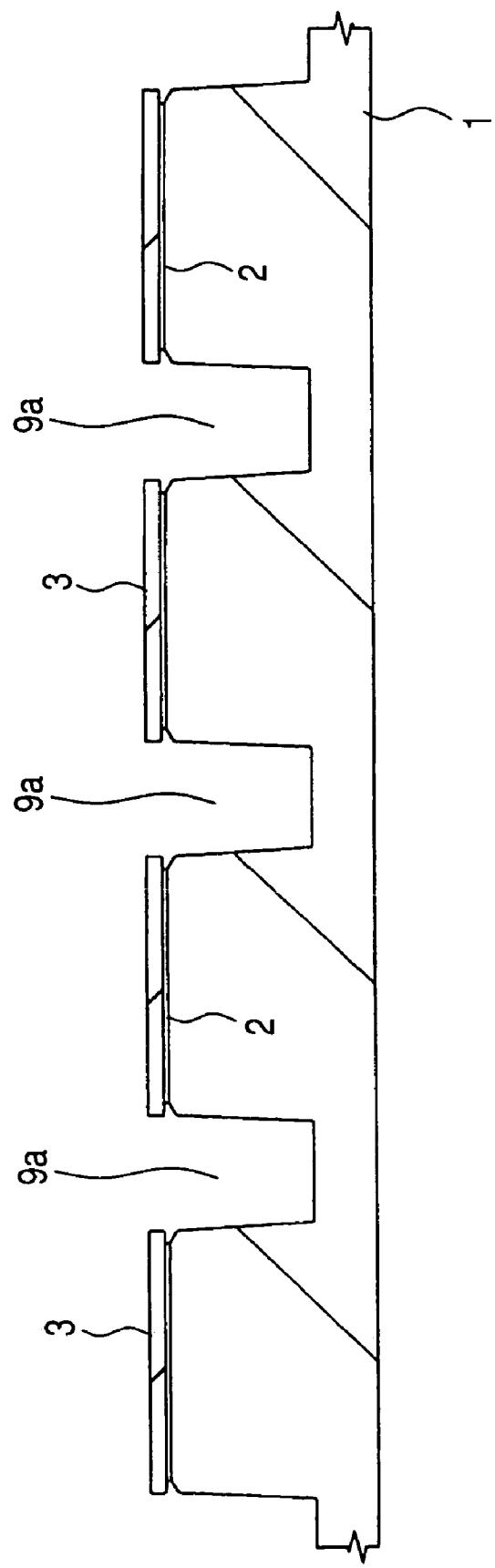
FIG. 12 is an enlarged cross sectional view for a main portion of a semiconductor substrate showing a manufacturing step of the semiconductor device succeeding to FIG. 11.

Then, as shown in FIG. 12, the substrate 1 is dry etched by using the silicon nitride film 3 as a mask to form a trench 9a of about 330 nm depth to the substrate 1 in the element isolation region. In this process, when the composition of an etching gas is controlled to provide a taper at about 80° on the side wall of the trench 9a, a silicon oxide film (11) is easily filled inside the trench 9a in the subsequent step.

Figure 13:
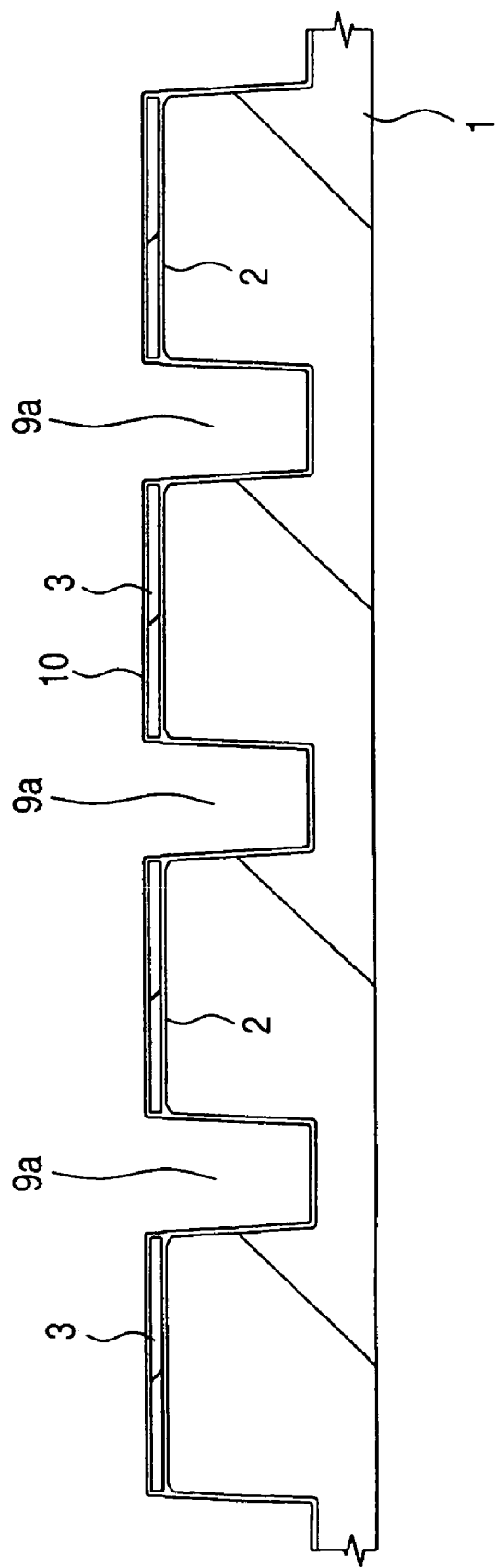
FIG. 13 is an enlarged cross sectional view for a main portion of a semiconductor substrate showing a manufacturing step of the semiconductor device succeeding to FIG. 12.
Figure 14:
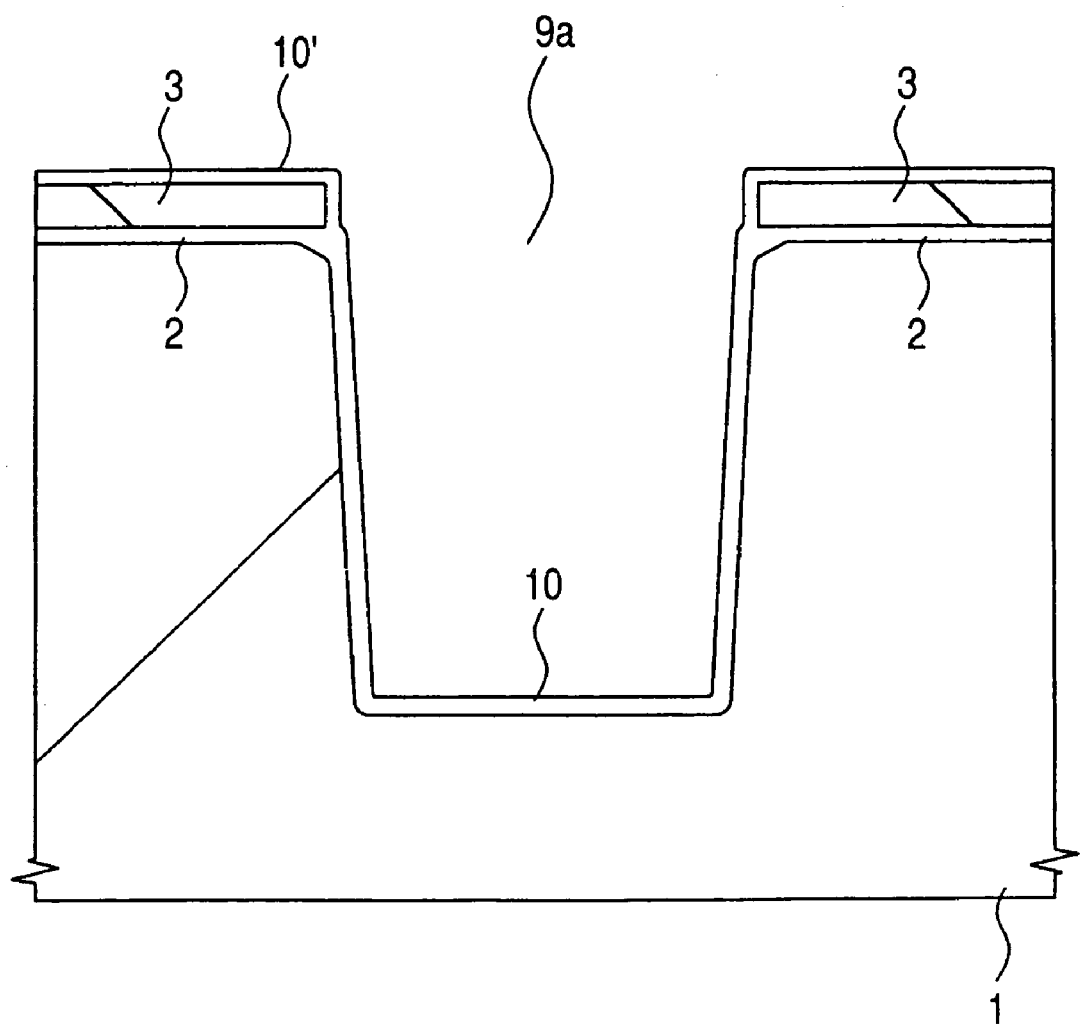
FIG. 14 is an enlarged cross sectional view for a main portion of a semiconductor substrate showing a manufacturing step of the semiconductor device succeeding to FIG. 13.

Then, after removing the etching residue deposited on the inner wall of the trench 9a by cleaning using the SC-1 solution, SC-2 solution and diluted hydrofluoric acid, the substrate 1 is oxidized to form a silicon oxide film 10 of about 20 nm thickness on the wall of the trench 9a as shown in FIG. 13. The silicon oxide film 10 is formed for the recovery of damages caused by dry etching formed on the inner wall of the trench 9a and moderating the stress generated at the boundary between the silicon oxide film (11) buried inside the trench 9a in the next step and the substrate 1. In this embodiment, as a method of oxidizing the substrate 1 to form the silicon oxide film 10 on the inner wall of the trench 9a, an ISSG oxidation method is used. As described above, the ISSG oxidation method is a method of directly introducing hydrogen and oxygen in a heat treatment chamber under a reduced pressure and conducting radical oxidation reaction over a heated substrate and it has a powerful oxidizing effect of oxidizing not only silicon but also silicon nitride. Accordingly, when the silicon oxide film 10 is formed on the inner wall of the trench 9a by using the ISSG oxidation method, a silicon oxide film 10' of about 13 nm thickness is formed on the upper surface and the side wall of the silicon nitride film 3 as shown in FIG. 14. The silicon oxide films 10, 10' formed by the ISSG oxidation method have a feature that the etching resistance to hydrofluoric acid is higher (etching rate is smaller) compared with the silicon oxide film deposited by the CVD method or the thermally oxidized film formed by the existent wet oxidation method. That is, they have smaller etching rate to the solution containing hydrofluoric acid than that of the insulation film (silicon oxide film 11) to be formed by the CVD method in the subsequent step. That is, the insulation film 11 is formed as a film for providing resistance to hydrofluoric acid. As described above In this embodiment, the silicon nitride film 3 that usually functions as the oxidation resistant film is positively oxidized to form the silicon oxide film 10' on the surface thereof.

Figure 15:
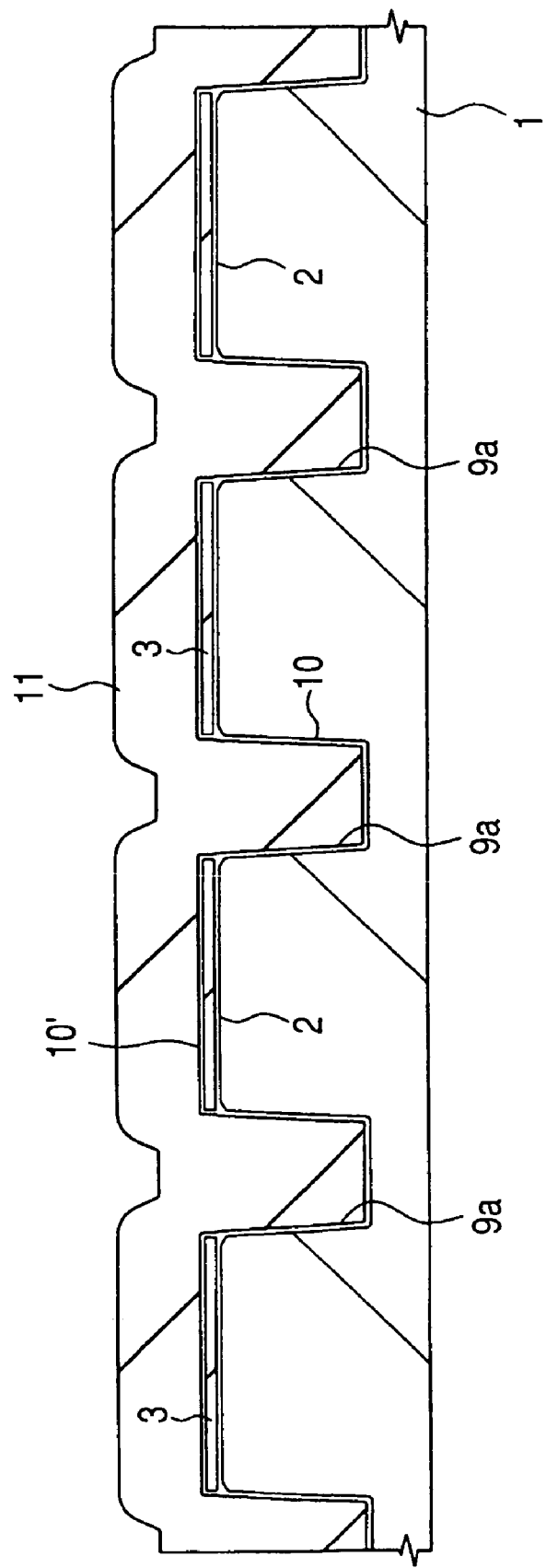
FIG. 15 is an enlarged cross sectional view for a main portion of a semiconductor substrate showing a manufacturing step of the semiconductor device succeeding to FIG. 14.

Then, as shown in FIG. 15, an insulation film is deposited in the trench 9a. The insulation film can be deposited by forming the silicon oxide film 11 over the substrate 1 including the inside of the trench 9a by using, for example, a high density plasma CVD method. The silicon oxide film 11 is deposited with a large thickness such that the film thickness above the trench 9a is about 600 nm, and the silicon oxide film 11 is filled with no gaps in the inside of the trench 9a. A silicon nitride film (not illustrated) may also be deposited thinly between the inner wall of the trench 9a and the silicon oxide film 10. The silicon nitride film has an effect of suppressing the growing to a larger thickness of the silicon oxide film 10 formed to the inner wall of the trench 9a on the side of the active region when the silicon oxide film 11 buried in the trench 9a is densified (shrink fit). The method of forming the silicon nitride film includes a method of deposition by a CVD method before forming the silicon oxide film 10 or a method of forming by applying a heat treatment in a nitrogen-containing atmosphere.

Figure 16:
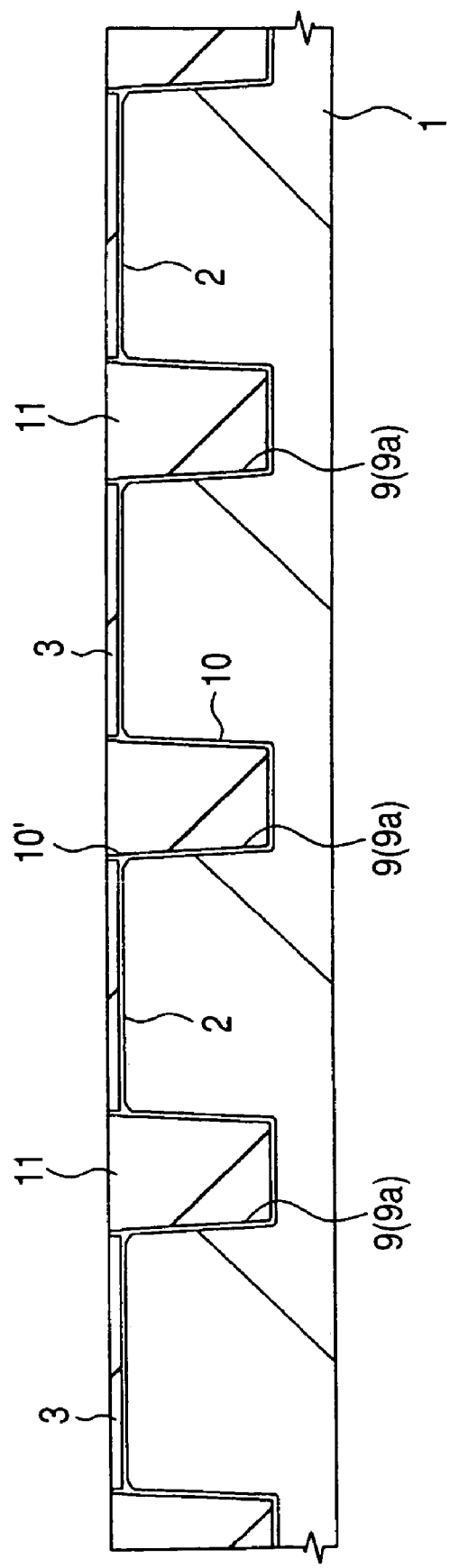
FIG. 16 is an enlarged cross sectional view for a main portion of a semiconductor substrate showing a manufacturing step of the semiconductor device succeeding to FIG. 15.

Then, after conducting densification (shrink fit) for improving the film quality of the silicon oxide film 11 buried in the trench 9a by thermal oxidation of the substrate 1 in a nitrogen atmosphere at about 1150° C., the silicon oxide film 11 above the trench 9a is polished by using a chemical mechanical polishing (CMP) method to planarize the surface thereof as shown in FIG. 16. Polishing is conducted by using the silicon nitride film 3 as a stopper till an end point where the height for the surface of the silicon oxide film 11 is identical with that for the silicon nitride film 3. Accordingly, when the polishing is conducted, while the silicon oxide film 10' on the upper surface of the silicon nitride film 3 is removed, the silicon oxide film 10' on the side wall of the silicon nitride film 3 remains. By the steps so far, an element isolation trench 9 in which the silicon oxide film 11 is buried inside the trench 9a is completed. Further, while the silicon oxide film 11 is polished by the CMP method, it can be conducted, for example, also by an etching back method as other method. Alternatively; it can also be conducted by the combination of an etching back method after conducting the CMP method.

Then, after densification (shrink fit), the silicon oxide film 11 over the silicon nitride film 3 can also be removed previously by dry etching using a photoresist film as a mask (not illustrated). As the pattern of the photoresist film in this case, a reversed pattern for the photoresist film used upon dry etching of the silicon nitride film 3 in the element isolation region can be used. As described above, by previously removing the silicon oxide film 11, since the amount of polishing for the silicon oxide film 11 in the CMP step can be decreased, the processing time in the CMP step can be shortened. Further, by decreasing the amount of polishing for the silicon oxide film 11, scattering of the film thickness after polishing in each of the element isolation regions can be decreased.

Figure 17:
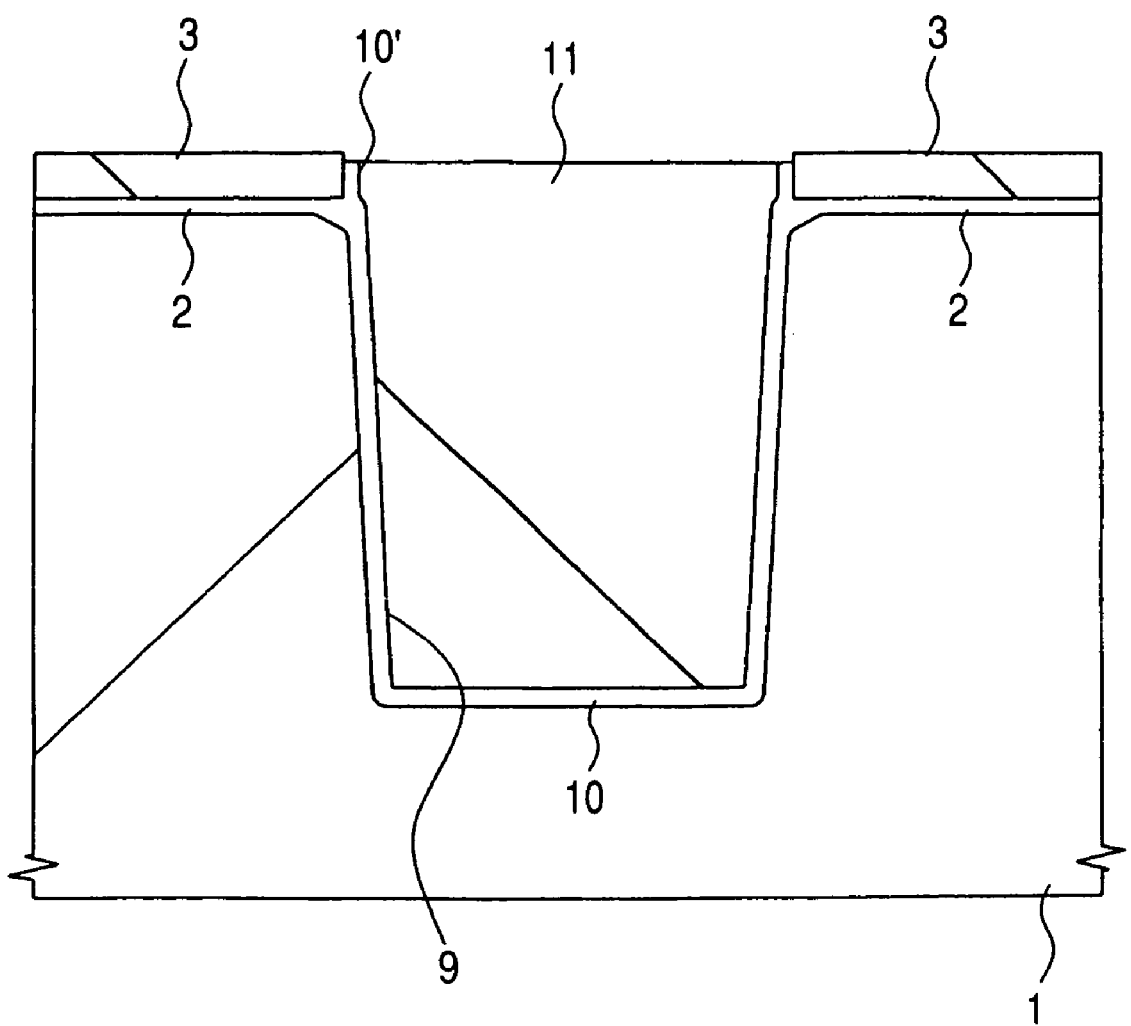
FIG. 17 is an enlarged cross sectional view for a main portion of a semiconductor substrate showing a manufacturing step of the semiconductor device succeeding to FIG. 16.
Figure 18:
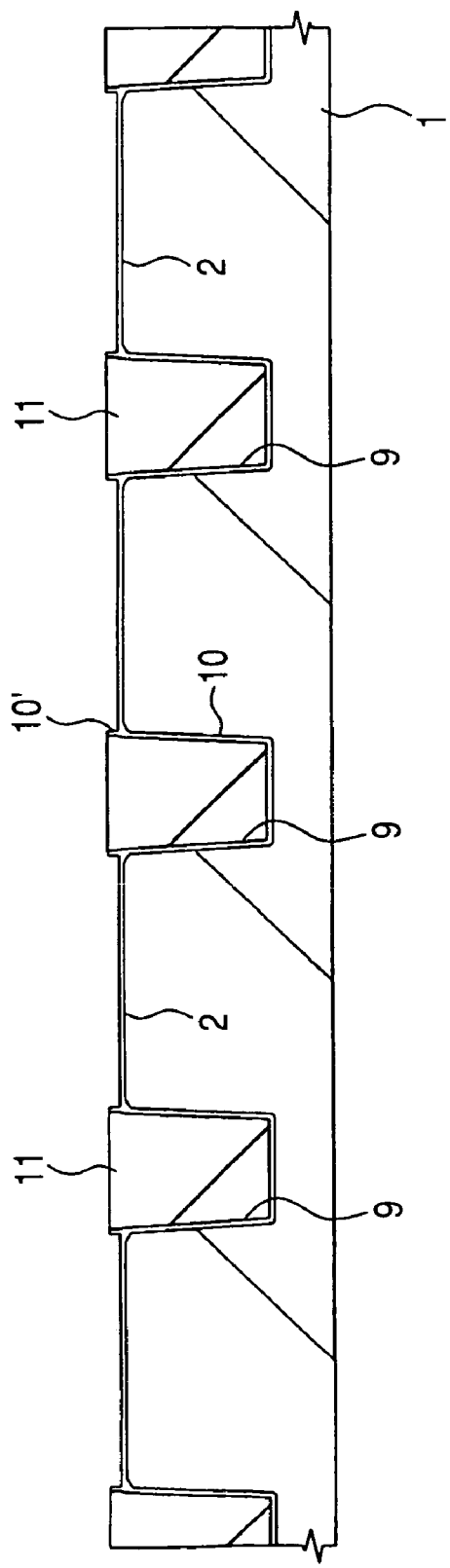
FIG. 18 is an enlarged cross sectional view for a main portion of a semiconductor substrate showing a manufacturing step of the semiconductor device succeeding to FIG. 17.
Figure 19:
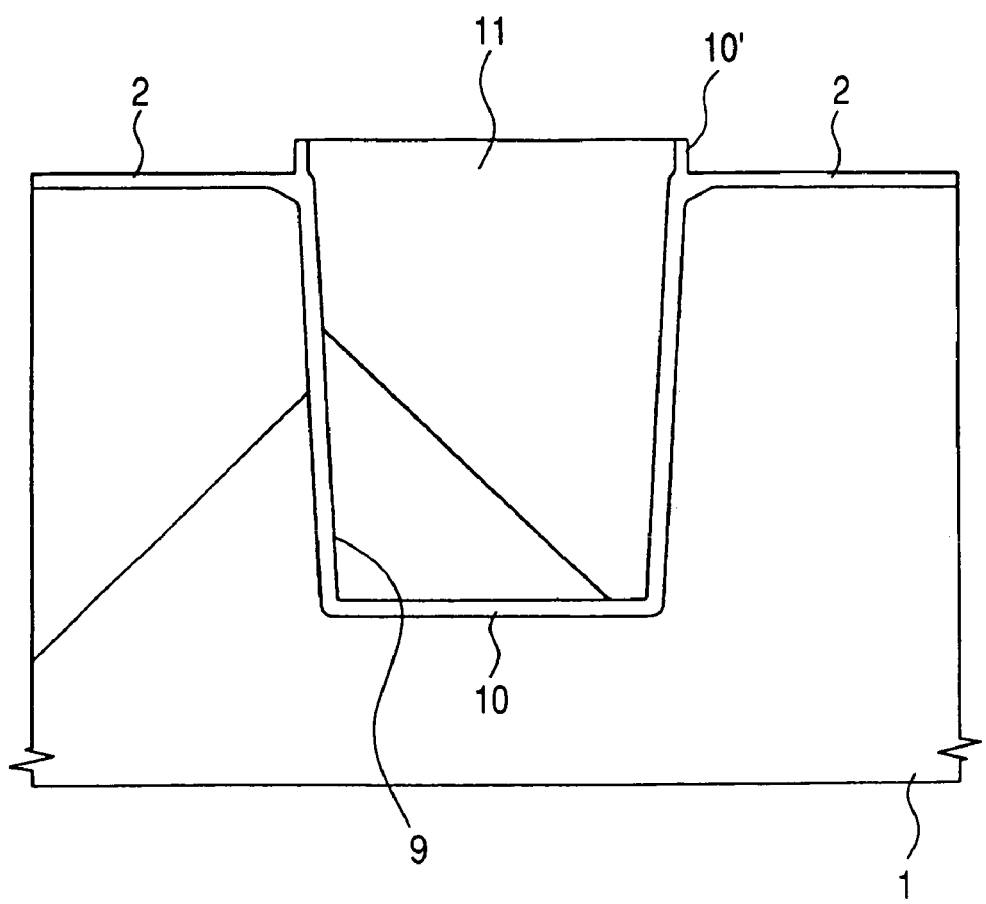
FIG. 19 is an enlarged cross sectional view for a main portion in FIG. 18.

Then, as shown in FIG. 17, after etching back the silicon oxide film 11 buried in the element isolation trench 9 and the silicon oxide film 10' on the side wall of the silicon nitride film 3 thereby slightly recessing the surface thereof from that of the silicon nitride film 3, the silicon nitride film 3 is removed by wet etching using hot phosphoric acid as shown in FIG. 18. In the wet etching using the hot phosphoric acid, since the etching selectivity of silicon nitride to silicon oxide is about 30, even when the silicon nitride film 3 is completely removed, the etching amount for the silicon oxide films 2, 10, 10', 11 is small. Accordingly, when the silicon nitride film 3 is removed by wet etching using hot phosphoric acid, a step is formed between the surface of the silicon oxide film 2 over the substrate 1 in the active region and the surface of the silicon oxide film 11 in the element isolation trench 9 and the silicon oxide film 10' formed on the side wall of the silicon nitride film 3 remains on the side wall of the silicon oxide film 11 as shown in an enlarged scale in FIG. 19.

Figure 20:
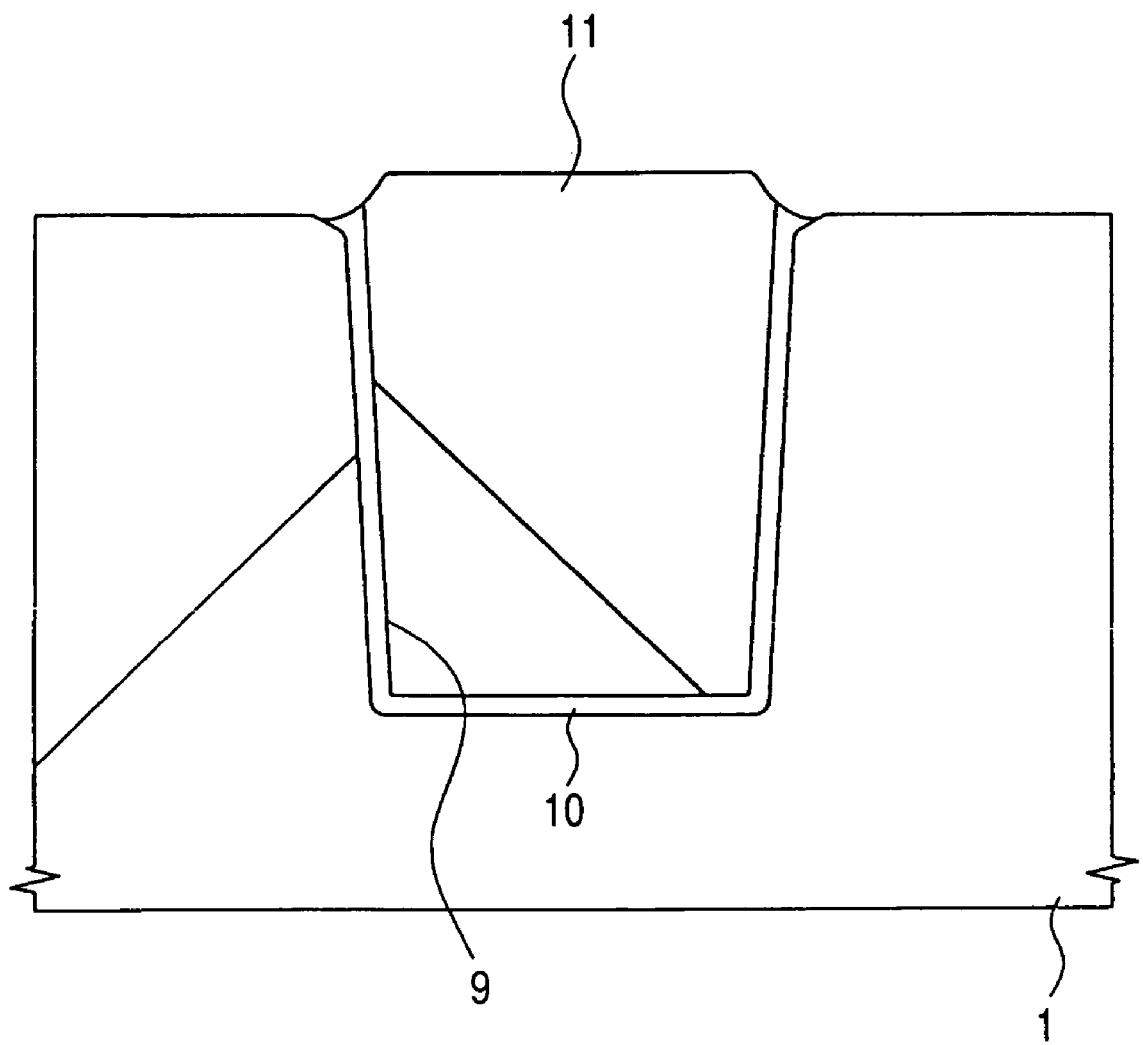
FIG. 20 is an enlarged cross sectional view for a main portion of a semiconductor substrate showing a manufacturing step of the semiconductor device succeeding to FIG. 18.
Figure 21:
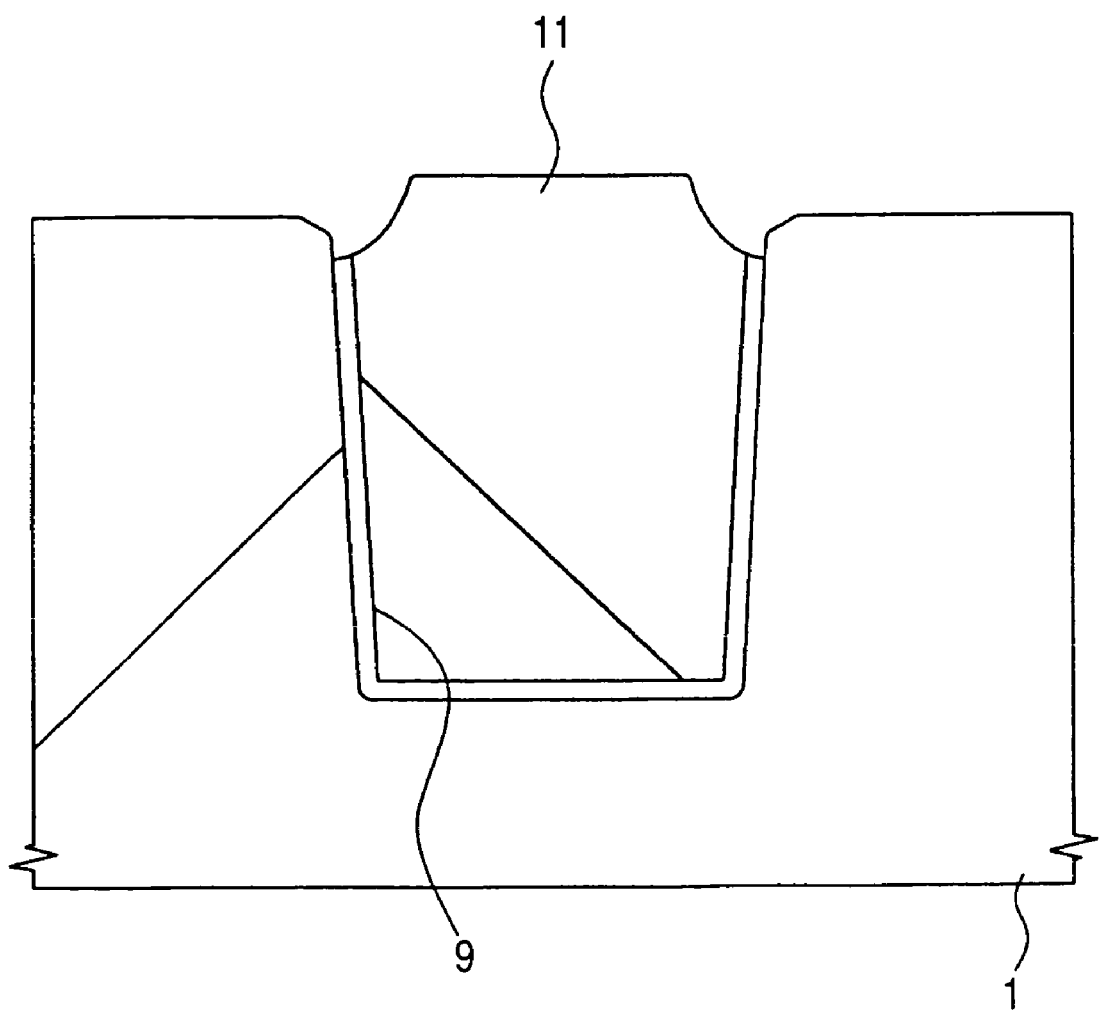
FIG. 21 is an enlarged cross sectional view for a main portion of a semiconductor substrate showing a manufacturing step of a comparative example.

Then, as shown in FIG. 20, the silicon oxide films 2, 10', and 11 are wet etched by using a hydrofluoric acid etching solution in order to decrease the step. When the wet etching is conducted, while only the upper surface thereof is exposed to the etching solution near the central portion of the element isolation trench 9, the upper surface and the lateral side thereof are exposed to the etching solution at the end of the element isolation trench 9. Then, since the silicon oxide film 10' formed by the ISSG oxidation method has smaller etching rate to hydrofluoric acid (about 0.83) compared with the silicon oxide film 11 deposited by the CVD method, in a case where the silicon oxide film 10' is formed on the side wall of the silicon oxide film 11, the recessing amount of the silicon film 11 at the end of the element isolation trench is suppressed. On the contrary, in a case where the silicon oxide film 10' is not formed on the side wall of the silicon oxide film 11, the silicon oxide film 11 at the end of the element isolation trench 9 is greatly recessed downward compared with the silicon oxide film 11 at the central portion as shown in FIG. 21. As described above, according to this embodiment of forming the silicon oxide film 10' with the etching rate being smaller than that of the silicon oxide film 11 buried in the element isolation trench 9, the recessing amount at the end of the element isolation trench 9 can be decreased.

Figure 22:
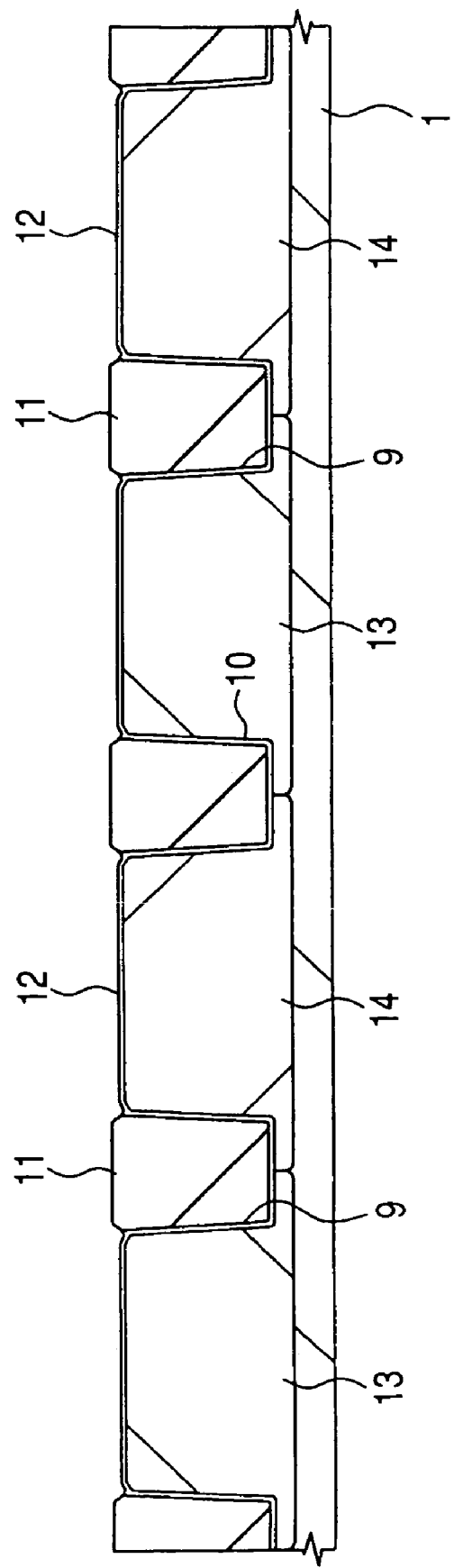
FIG. 22 is an enlarged cross sectional view for a main portion of a semiconductor substrate showing a manufacturing step of the semiconductor device succeeding to FIG. 20.

Then, as shown in FIG. 22, the substrate 1 is thermally oxidized at about 800 to 1100° C. to form a silicon oxide film 12 of about 15 nm thickness over the surface of the substrate 1 in the active region. Successively, n-type impurities (for example, phosphorus) are ion implanted to a determined portion of the substrate 1 through the silicon oxide film 12 and p-type impurities (boron) are ion implanted into other portion and then the substrate 1 is heat treated at about 950° C. to apply extending diffusion to the impurities thereby forming a p-type well 13 in determined portion and forming an n-type well 14 in other portion of the substrate 1.

Figure 23:
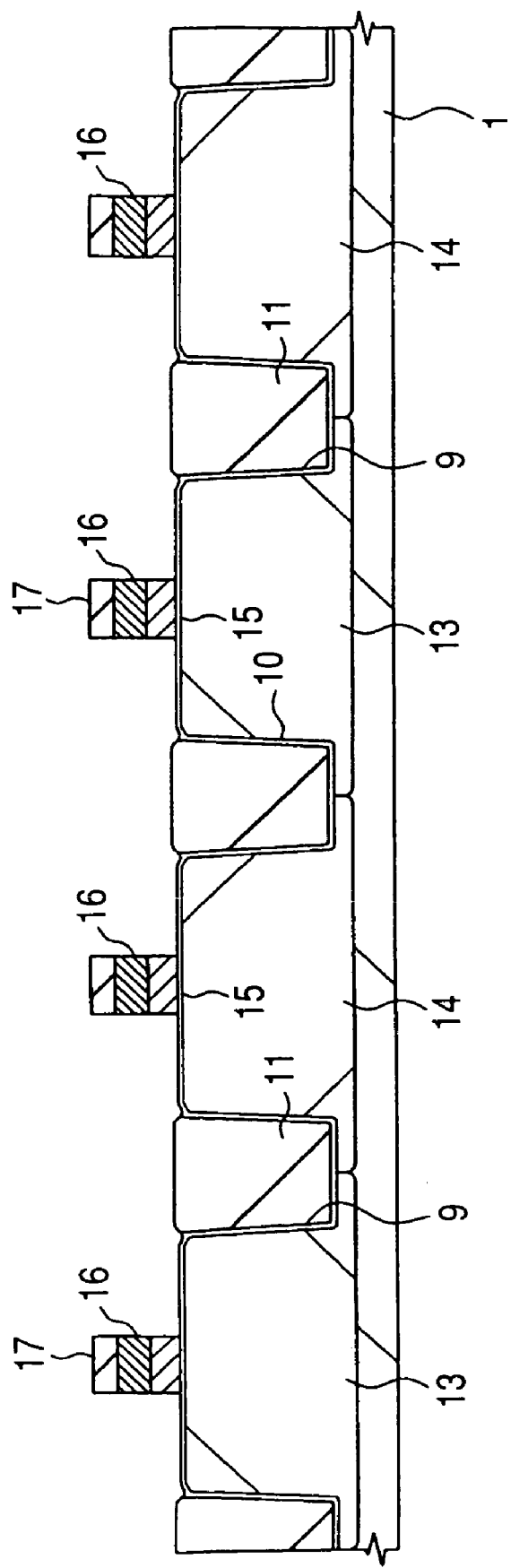
FIG. 23 is an enlarged cross sectional view for a main portion of a semiconductor substrate showing a manufacturing step of the semiconductor device succeeding to FIG. 22.
Figure 24:
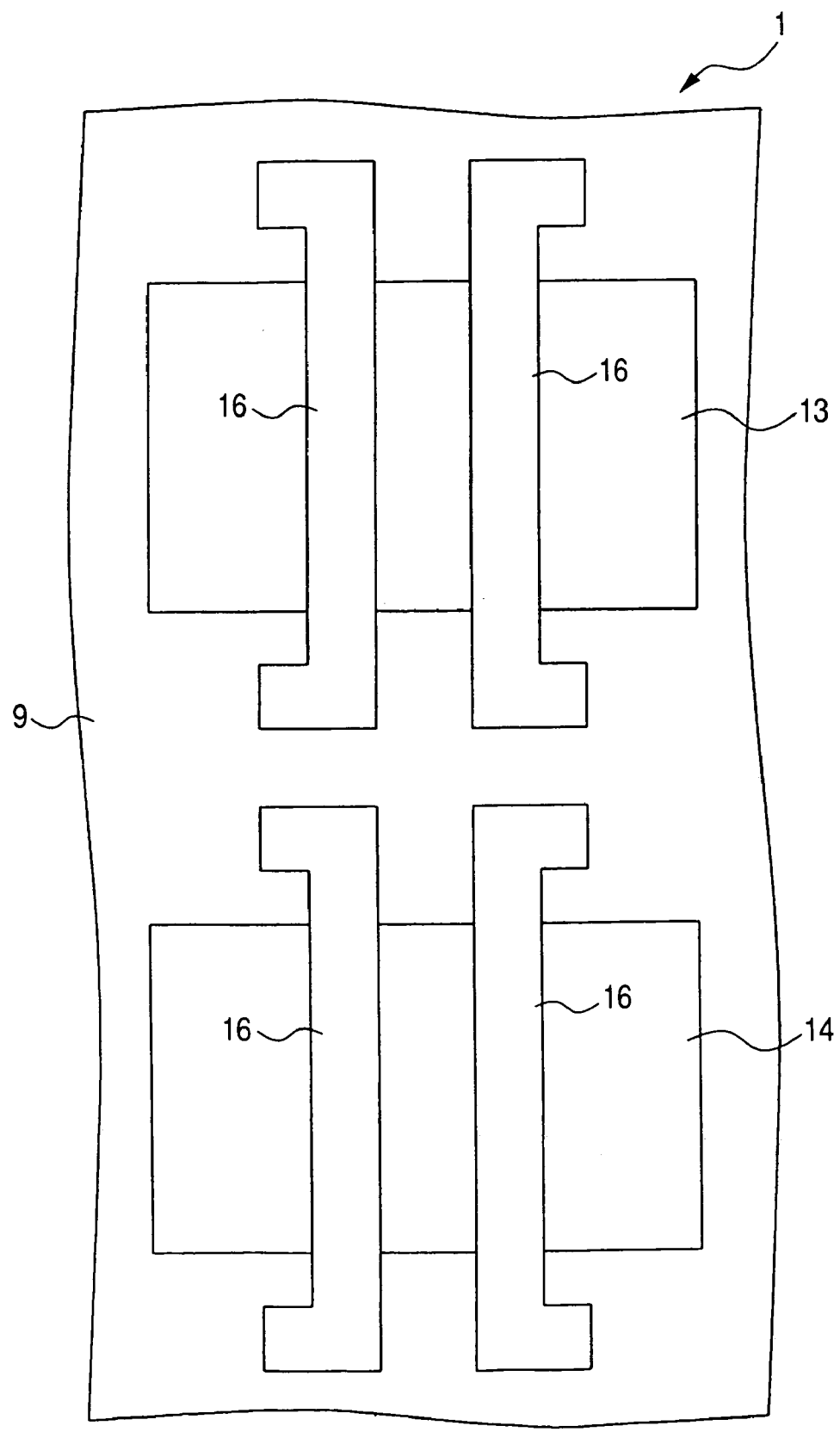
FIG. 24 is a plan view showing gate electrodes formed to each of a p-type well and an n-type well.

Then, after removing the silicon film 12 over the surface of the substrate 1 by wet etching using hydrofluoric acid, a gate insulation film 15 is formed over the substrate 1 as shown in FIG. 23. At the gate insulation film 15, the substrate 1 is thermally oxidized at about 800 to 850° C. to form a clean gate oxide film of about 4 nm thickness over the surface thereof. Successively, a gate electrode 16 is formed over the gate insulation film 15. The gate electrode 16 comprises a conductive film, which is formed, for example, by depositing a polycrystal silicon film doped with phosphorus over the gate insulation film 15 by a CVD method, successively depositing a WSi (tungsten silicide) film thereover, further, depositing a silicon oxide film 17 by a CVD method thereover and then patterning the films by dry etching using a photoresist film (not illustrated) as a mask. FIG. 24 is a plan view showing gate electrodes 16 formed to the p-type well 13 and the n-type well 14, respectively.

According to this embodiment, when the gate electrode material is dry etched to form the gate electrode 16, since the recessing amount at the end of the element isolation trench 9 is decreased, etching residues of the gate electrode material are not formed along the boundary between the element isolation trench 9 and the active region (p-type well 13, n-type well 14), so that failure of short-circuit between adjacent gate electrodes 16 to each other can be prevented.

Figure 25:
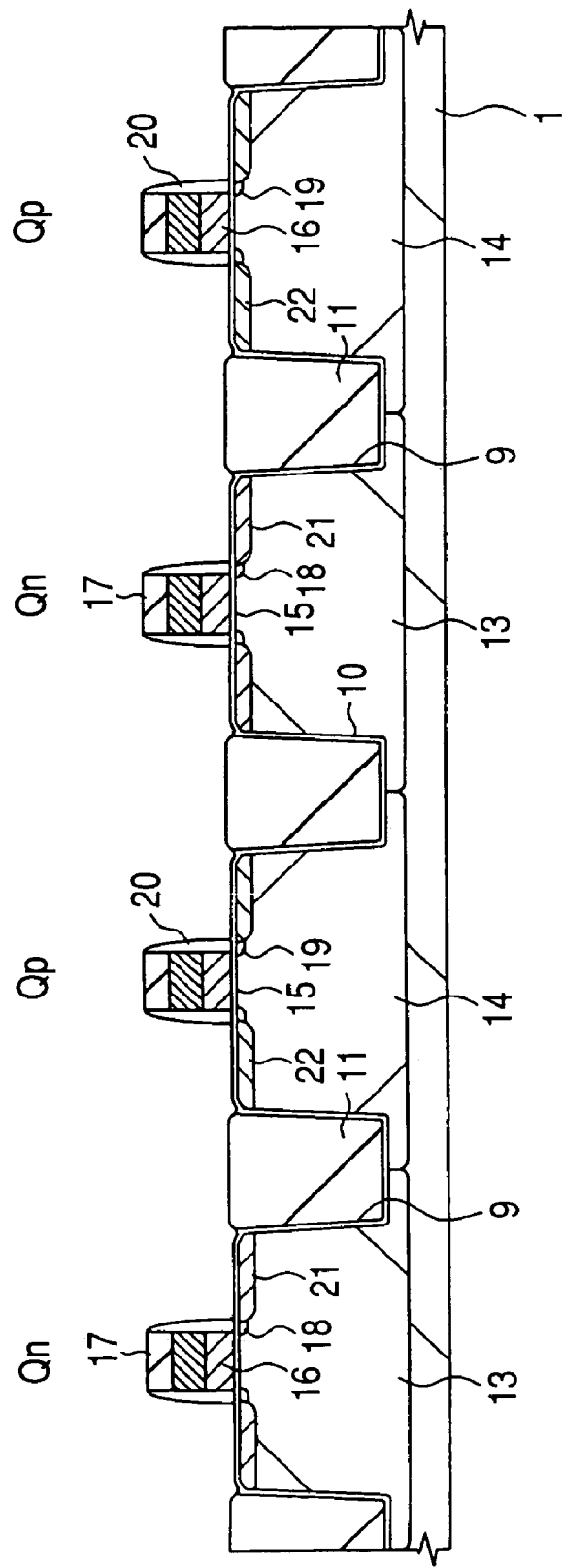
FIG. 25 is an enlarged cross sectional view for a main portion of a semiconductor substrate showing a manufacturing step of the semiconductor device succeeding to FIG. 23.

Then, as shown in FIG. 25, after ion implanting n-type impurities (phosphorus or arsenic) into the p-type well 13 to form an n$^-$-type semiconductor region 18 and ion implanting p-type impurities (boron) into the n-type well 14 to form a p$^-$-type semiconductor region 19, a silicon oxide film deposited over the substrate 1 by a CVD method is etched anisotropically thereby forming a side wall spacer 20 on the side wall of the gate electrode 16. Then, n-type impurities (phosphorus or arsenic) are implanted to the p-type well 13 to form an n$^+$-type semiconductor region 21 (source, drain) at high impurity concentration, and p-type impurities (boron) are implanted into the n-type well 14 to form a p$^+$-type semiconductor region 22 (source, drain) at high impurity concentration. By the steps so far, an n-channel type MISFET (Qn) and a p-channel type MISFET (Qp) are completed.

According to this embodiment, since the phenomenon that the thickness of the gate insulation film 15 formed over the surface of the substrate 1 in the active region is decreased locally at the end (shoulder) of the active region is suppressed by the decrease of the recessing amount at the end of the element isolation trench 9, the kink characteristic for each of the n-channel type MISFET (Qn) and the p-channel type MISFET (Qp) can be suppressed.

The effects obtained by typical embodiments among those disclosed in the present invention are to be described briefly as below.

Obstacles caused by the ingredients constituting the anti-reflection film can be removed by forming a silicon oxide film over the silicon nitride film and wet etching the silicon oxide film. Further, needle-like protrusions can be removed by applying thermal oxidation and wet cleaning after patterning the silicon nitride film. This can prevent dielectric breakdown of the gate electrode caused by needle-like protrusions. This can improve the reliability of the semiconductor device.

Since the recessing amount at the end of the isolation trench is decreased, etching residues of the gate electrode material are not formed along the boundary between the element isolation trench and the active region upon dry etching the gate electrode material to form the gate electrode, occurrence of failure of short-circuit between adjacent gate electrode to each other can be prevented. This can improve the reliability of the semiconductor device.

Since the phenomenon in which the thickness of the gate oxide film formed over the surface of the substrate in the active region is decreased locally at the end (shoulder) of the active region is suppressed by decreasing the recessing amount at the end of the element isolation trench, the kink characteristic of the MISFET can be suppressed. This can improve the reliability of the semiconductor device.

The present invention made by the present inventors has been described above specifically with reference to preferred embodiments but it will be apparent that the invention is not restricted to the embodiments described above and can be modified variously within the scope not departing from the gist thereof.

The present invention concerns a semiconductor integrated circuit and a manufacturing technique thereof and, particularly, it relates to a technique effective to application for the manufacture of an element isolation structure for forming a micro-fine MISFET (metal insulator semiconductor field effect transistor) and a process for the formation thereof.

What is claimed is:

1. A method of manufacturing a semiconductor device comprising the steps of:
   (a) forming a silicon nitride film by way of a first silicon oxide film over the main surface of a silicon substrate;
   (b) forming a second silicon oxide film over the silicon nitride film, and then forming a photoresist film in which a element isolation region is opened over the second silicon oxide film;
   (c) applying a wet etching treatment to the second silicon oxide film, exposed through the photoresist film, in the element isolation region, after the step (b);
   (d) dry etching the silicon nitride film and the first silicon oxide film by using the photoresist film as a mask after the step (c), thereby exposing the silicon substrate in the element isolation region;
   (e) removing the photoresist film;
   (f) dry etching the silicon substrate by using the silicon nitride film as a mask after the step (e), thereby forming a trench in the silicon substrate in the element isolation region;
   (g) forming a third silicon oxide film over the silicon substrate including the inside of the trench, then removing the third silicon oxide film outside the trench by a chemical mechanical polishing method, or a chemical mechanical polishing method followed by etching back, to leave the third silicon oxide film inside the trench, thereby forming an element isolation trench in the silicon substrate in the element isolation region; and
   (h) removing the silicon nitride film.

2. A method of manufacturing a semiconductor device according to claim 1, wherein the second silicon oxide film is formed by an ISSG oxidation method.

3. A method of manufacturing a semiconductor device according to claim 1, wherein the second silicon oxide film is formed by a CVD method.

4. A method of manufacturing a semiconductor device according to claim 1, wherein an anti-reflection film is disposed to a layer below the photoresist film.

5. A method of manufacturing a semiconductor device according to claim 1, which further includes, between the step (e) and the step (f), the steps of:
   (i) applying a wet etching treatment to the silicon substrate exposed in the element isolation region thereby recessing the end of the first silicon oxide film exposed below the silicon nitride film to the inner side than the end of the silicon nitride film;
   (j) thermally oxidizing the silicon substrate thereby forming a fourth silicon oxide film having a thickness larger than that of the first silicon oxide film over the surface of the silicon substrate exposed in the element isolation region; and
   (k) removing the fourth silicon oxide film by wet etching, thereby forming an inclined surface to the surface of the silicon substrate below the end of the silicon nitride film.

6. A method of manufacturing a semiconductor device according to claim 1, which further includes, after the step (h), a step of:
   (l) introducing impurities for forming a well in the silicon substrate.

7. A method of manufacturing a semiconductor device according to claim 1, which further includes, after the step (h), a step of:

(m) forming a gate insulation film over the surface of the silicon substrate and forming a gate electrode of an MISFET over the gate insulation film.

8. A method of manufacturing a semiconductor device according to claim 1, which further includes, between the step (f) and the step (g), a step of:
(n) oxidizing the silicon substrate, thereby forming a fifth silicon oxide film on the inner wall of the trench.

9. A method of manufacturing a semiconductor device according to claim 8, wherein the fifth silicon oxide film is formed by an ISSG oxidation method, and the surface of the silicon nitride film is oxidized simultaneously.

10. A method of manufacturing a semiconductor device comprising the steps of:
(a) forming a silicon nitride film by way of a first silicon oxide film over the main surface of a silicon substrate;
(b) forming a photoresist film in which an element isolation region is opened over the silicon nitride film;
(c) dry etching the silicon nitride film and the first silicon oxide film by using the photoresist film as a mask, thereby exposing the silicon substrate in the element isolation region;
(d) removing the photoresist film;
(e) dry etching the silicon substrate using the silicon nitride film as a mask after the step (d), thereby forming a trench in the silicon substrate in the element isolation region;
(f) oxidizing the silicon substrate exposed inside the trench and the silicon nitride film respectively by using an ISSG oxidation method after the step (e), thereby forming a second silicon oxide film on the inner wall of the trench, and forming a third silicon oxide film on the upper surface and the side wall of the silicon nitride film;
(g) forming a fourth silicon oxide film over the silicon substrate including inside the trench after the step (f), then removing the fourth silicon oxide film outside the trench by a chemical polishing method to leave the fourth silicon oxide film inside the trench, thereby forming an element isolation trench in the silicon substrate in the element isolation region;
(h) removing the silicon nitride film by wet etching;
(i) applying a wet etching treatment to the first, third and fourth silicon oxide films after the step (h); and
(j) between the step (g) and the step (h), etching back the third and the fourth silicon oxide films, thereby recessing the respective surfaces of the third and the fourth silicon oxide films to a portion lower than the silicon nitride film.

11. A method of manufacturing a semiconductor device according to claim 10, which further includes, after the step (i), the steps of:
(k) oxidizing the silicon substrate, thereby forming a fifth silicon oxide film over the surface of the silicon substrate surrounded with the element isolation trenches; and
(l) introducing impurities for forming a well in the silicon substrate after the step (k).

12. A method of manufacturing a semiconductor device according to claim 11, which further includes, after the step (l), a step of:
(m) forming a gate insulation film over the surface of the silicon substrate and forming a gate electrode of an MISFET over the gate insulation film.

13. A method of manufacturing a semiconductor device comprising the steps of:

(a) forming a silicon nitride film by way of a first silicon oxide film over the main surface of a silicon substrate;
(b) forming a second silicon oxide film over the silicon nitride film and then forming a photoresist film in which an element isolation region is opened over the second silicon oxide film;
(c) applying a wet etching treatment to the second silicon oxide film exposed in the element isolation region after the step (b);
(d) dry etching the silicon nitride film and the first silicon oxide film by using the photoresist film as a mask after the step (c), thereby exposing the silicon substrate in the element isolation region;
(e) removing the photoresist film;
(f) dry etching the silicon substrate by using the silicon nitride film as a mask after the step (e), thereby forming a trench in the silicon substrate in the element isolation region;
(g) oxidizing the silicon substrate exposed inside the trench and the silicon nitride film respectively by using an ISSG oxidation method after the step (f), thereby forming a third silicon oxide film on the inner wall of the trench and forming a fourth silicon oxide film on the upper surface and on the side wall of the silicon nitride film;
(h) forming a fifth silicon oxide film over the silicon substrate including inside of the groove after the step (g), removing the fifth silicon oxide film outside the trench by a chemical mechanical polishing method or a chemical mechanical polishing method, followed by etching back after the step (g), thereby forming an element isolation trench in the silicon substrate in the element isolation region;
(i) removing the silicon nitride film by wet etching; and
(j) applying a wet etching treatment to the first, fourth and fifth silicon oxide films, after the step (i).

14. A method of manufacturing a semiconductor device according to claim 13, wherein the second silicon oxide film is formed by a thermal oxidation method.

15. A method of manufacturing a semiconductor device according to claim 13, wherein the second silicon oxide film is formed by a CVD method.

16. A method of manufacturing a semiconductor device according to claim 13, wherein an anti-reflection film is disposed to a layer below the photoresist film.

17. A method of manufacturing a semiconductor device according to claim 13, which further includes, between the step (e) and the step (f), the steps of:
(k) applying a wet etching treatment to the silicon substrate exposed in the element isolation region, thereby recessing the end of the first silicon oxide film exposed below the end of the silicon nitride film to the inner side than the end of the silicon nitride film;
(l) thermally oxidizing the silicon substrate, thereby forming a sixth silicon oxide film having a thickness larger than that of the first silicon oxide film over the surface of the silicon substrate exposed in the element isolation region; and
(m) removing the sixth silicon oxide film by wet etching, thereby forming an inclined surface to the surface of the silicon substrate below the end of the silicon nitride film.

18. A method of manufacturing a semiconductor device according to claim 13, which further includes, after the step (j), the steps of:

(n) oxidizing the silicon substrate, thereby forming a seventh silicon oxide film over the surface of the silicon substrate in an active region surrounded with element isolation trenches; and (o) introducing impurities for forming a well to the silicon substrate after the step (n).

19. A method of manufacturing a semiconductor device according to claim 18, which further includes, after the step (o), a step of:

(p) forming a gate insulation film over the surface of the silicon substrate and forming a gate electrode film of an MISFET over the gate insulation film.

20. A method of manufacturing a semiconductor device comprising the steps of:

(a) forming a silicon nitride film by way of a first silicon oxide film over the main surface of a silicon substrate;

(b) forming a silicon film over the silicon nitride film, and then forming a photoresist film in which a element isolation region is opened over the silicon film;

(c) applying a wet etching treatment to the silicon film, exposed through the photoresist film, in the element isolation region, after the step (b);

(d) dry etching the silicon nitride film and the first silicon oxide film by using the photoresist film as a mask after the step (c), thereby exposing the silicon substrate in the element isolation region;

(e) removing the photoresist film;

(f) dry etching the silicon substrate by using the silicon nitride film as a mask after the step (e), thereby forming a trench in the silicon substrate in the element isolation region;

(g) forming a second silicon oxide film over the silicon substrate including the inside of the trench, then removing the second silicon oxide film outside the trench by a chemical mechanical polishing method, or a chemical mechanical polishing method followed by etching back, to leave the second silicon oxide film inside the trench, thereby forming an element isolation trench in the silicon substrate in the element isolation region; and (h) removing the silicon nitride film.

21. A method of manufacturing a semiconductor device comprising the steps of:

(a) forming a silicon nitride film by way of a first silicon oxide film over the main surface of a silicon substrate;

(b) forming a silicon film over the silicon nitride film and then forming a photoresist film in which an element isolation region is opened over the silicon film;

(c) applying a wet etching treatment to the silicon film exposed in the element isolation region after the step (b);

(d) dry etching the silicon nitride film and the first silicon oxide film by using the photoresist film as a mask after the step (c), thereby exposing the silicon substrate in the element isolation region;

(e) removing the photoresist film;

(f) dry etching the silicon substrate by using the silicon nitride film as a mask after the step (e), thereby forming a trench in the silicon substrate in the element isolation region;

(g) oxidizing the silicon substrate exposed inside the trench and the silicon nitride film respectively by using an ISSG oxidation method after the step (f), thereby forming a second silicon oxide film on the inner wall of the trench and forming a third silicon oxide film on the upper surface and on the side wall of the silicon nitride film;

(h) forming a fourth silicon oxide film over the silicon substrate including inside of the groove after the step (g), removing the fourth silicon oxide film outside the trench by a chemical mechanical polishing method or a chemical mechanical polishing method, followed by etching back after the step (g), thereby forming an element isolation trench in the silicon substrate in the element isolation region;

(i) removing the silicon nitride film by wet etching; and (j) applying a wet etching treatment to the first, third and fourth silicon oxide films, after the step (i).

\* \* \* \* \*